United States Patent
Kang et al.

(10) Patent No.: US 12,506,049 B2
(45) Date of Patent: Dec. 23, 2025

(54) TRANSISTORS WITH BACKSIDE SOURCE/DRAIN CONTACT AND SPACER

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 18/075,034

(22) Filed: Dec. 5, 2022

(65) Prior Publication Data

US 2024/0186219 A1    Jun. 6, 2024

(51) Int. Cl.
| | | |
|---|---|---|
| *H01L 23/48* | (2006.01) | |
| *H10D 30/67* | (2025.01) | |
| *H10D 62/10* | (2025.01) | |
| *H10D 64/01* | (2025.01) | |

(52) U.S. Cl.
CPC ....... *H01L 23/481* (2013.01); *H10D 30/6729* (2025.01); *H10D 30/6757* (2025.01); *H10D 62/121* (2025.01); *H10D 64/021* (2025.01)

(58) Field of Classification Search
None
See application file for complete search history.

(56) References Cited

U.S. PATENT DOCUMENTS

| | | | |
|---|---|---|---|
| 3,962,052 A | 6/1976 | Abbas et al. | |
| 5,811,868 A | 9/1998 | Bertin et al. | |
| 5,814,889 A | 9/1998 | Gaul | |
| 5,998,292 A | 12/1999 | Black et al. | |
| 6,198,168 B1 | 3/2001 | Geusic et al. | |
| 7,276,787 B2 | 10/2007 | Edelstein et al. | |
| 7,935,571 B2 | 5/2011 | Ramiah et al. | |
| 8,276,002 B2 | 9/2012 | Dennard et al. | |
| 8,344,512 B2 | 1/2013 | Knickerbocker | |
| 8,445,918 B2 | 5/2013 | Bartley et al. | |
| 10,008,577 B2 | 6/2018 | Xie et al. | |
| 10,586,765 B2 | 3/2020 | Smith et al. | |
| 10,636,739 B2 | 4/2020 | Beyne et al. | |
| 10,797,139 B2 | 10/2020 | Morrow et al. | |

(Continued)

FOREIGN PATENT DOCUMENTS

CN        111752807 B      1/2025

OTHER PUBLICATIONS

J. Ryckaert et al., "Extending the Roadmap Beyond 3nm through System Scaling Boosters: A Case Study on Buried Power Rail and Backside Power Delivery," Electron Devices Technology and Manufacturing Conference (EDTM), Mar. 2019, pp. 50-52.

(Continued)

*Primary Examiner* — Nilufa Rahim

(74) *Attorney, Agent, or Firm* — L. Jeffrey Kelly; Ryan, Mason & Lewis, LLP

(57) ABSTRACT

A semiconductor structure includes a first backside power rail disposed on a portion of a sidewall and a bottom surface of a backside source/drain contact, a first sidewall spacer disposed on another sidewall of the backside source/drain contact, and a backside signal line disposed on the first sidewall spacer and separated from the backside source/drain contact.

20 Claims, 39 Drawing Sheets

(56) References Cited

U.S. PATENT DOCUMENTS

| | | |
|---|---|---|
| 10,833,089 B2 | 11/2020 | Pille et al. |
| 10,957,575 B2 | 3/2021 | Yakimets et al. |
| 10,985,064 B2 | 4/2021 | Zhang et al. |
| 11,271,567 B1 | 3/2022 | Chen et al. |
| 2018/0145030 A1 | 5/2018 | Beyne et al. |
| 2018/0218973 A1 | 8/2018 | Nelson et al. |
| 2019/0164882 A1 | 5/2019 | Chen et al. |
| 2019/0326405 A1 | 10/2019 | Morrow et al. |
| 2020/0105671 A1 | 4/2020 | Lai et al. |
| 2020/0266169 A1 | 8/2020 | Kang et al. |
| 2020/0294998 A1 | 9/2020 | Lilak et al. |
| 2020/0373242 A1 | 11/2020 | Hiblot et al. |
| 2021/0104435 A1 | 4/2021 | Son et al. |
| 2021/0111115 A1 | 4/2021 | Morrow et al. |
| 2021/0118798 A1 | 4/2021 | Liebmann et al. |
| 2021/0134721 A1 | 5/2021 | Chiang et al. |
| 2021/0202385 A1 | 7/2021 | Huang et al. |
| 2021/0202472 A1 | 7/2021 | Thomson et al. |
| 2021/0296234 A1 | 9/2021 | Dechene et al. |
| 2022/0130759 A1 | 4/2022 | Huang et al. |
| 2022/0147679 A1 | 5/2022 | Edathil et al. |
| 2022/0165733 A1 | 5/2022 | Chen et al. |
| 2022/0165856 A1 | 5/2022 | Yu et al. |
| 2022/0301878 A1 | 9/2022 | Xie et al. |
| 2023/0015572 A1* | 1/2023 | Khaderbad ....... H01L 21/76825 |
| 2023/0060766 A1 | 3/2023 | Thomas et al. |
| 2023/0067354 A1* | 3/2023 | Wei ..................... H01L 21/0259 |
| 2023/0068312 A1* | 3/2023 | Parikh .................. H10D 84/038 |
| 2023/0369222 A1* | 11/2023 | Engel .................. H10D 30/014 |
| 2024/0095092 A1 | 3/2024 | Gosain et al. |
| 2024/0126471 A1 | 4/2024 | Doucette et al. |

OTHER PUBLICATIONS

Bikram Gyawali, "The Ultimate Guide to Top 10 Databases Powering Modern Technology: Use Cases, Pros, and Cons", https://medium.com/@vikramgyawali57/the-ultimate-guide-to-top-10-databases-powering-modern-technology-use-cases-pros-and-cons-a5d34d79d623, • Jul. 5, 2023, 13 pages.

No Author, "Apache Hadoop", https://hadoop.apache.org/releases.html, dated May 19, 2025, 3 pages.

No Author, "Edge Computing Solutions", https://www.ibm.com/edge-computing, dated May 19, 2025, 4 pages.

No Author, "IBM Cloud Kubernetes Service", https://ibm.blackboxip.com/blackbox/reference/management/addRefPending, dated May 19, 2025, 5 pages.

No Author, "IBM Cloud Satellite", https://www.ibm.com/products/satellite, dated May 19, 2025, 6 pages.

No Author, "Red Hat OpenShift on IBM Cloud", https://www.ibm.com/products/openshift, dated May 19, 2025, 5 pages.

No Author, "Serverless on IBM Cloud", https://www.ibm.com/products/code-engine, dated May 19, 2025, 5 pages.

No Author, "Service", https://kubernetes.io/docs/concepts/services-networking/service/#publishing-services-service-types, Apr. 9, 2025, 15 pages.

Puru Tuladhar, "Kubernetes: Evenly Distribution of Pods Across Cluster Nodes", https://medium.com/geekculture/kubernetes-distributing-pods-evenly-across-cluster-c6bdc9b49699, Dec. 1, 2021, 9 pages.

* cited by examiner

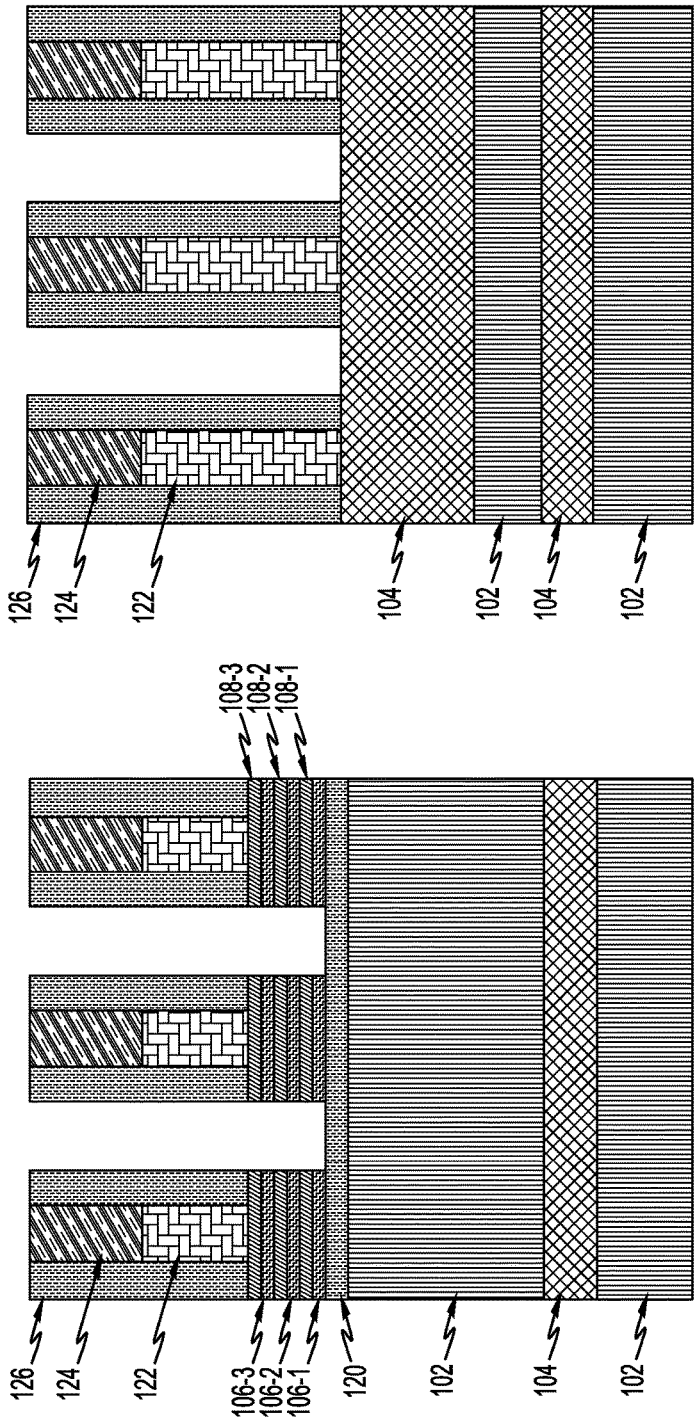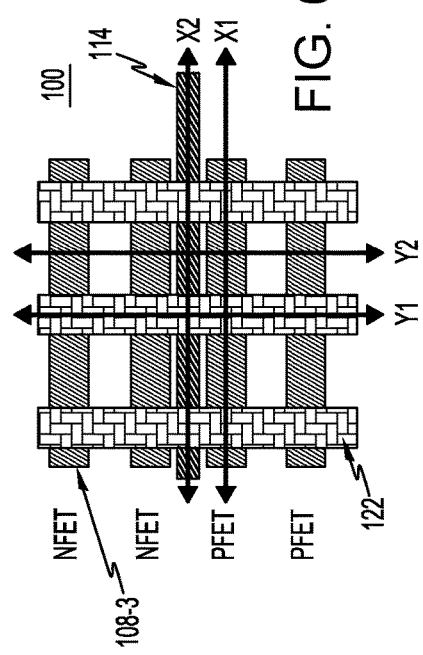

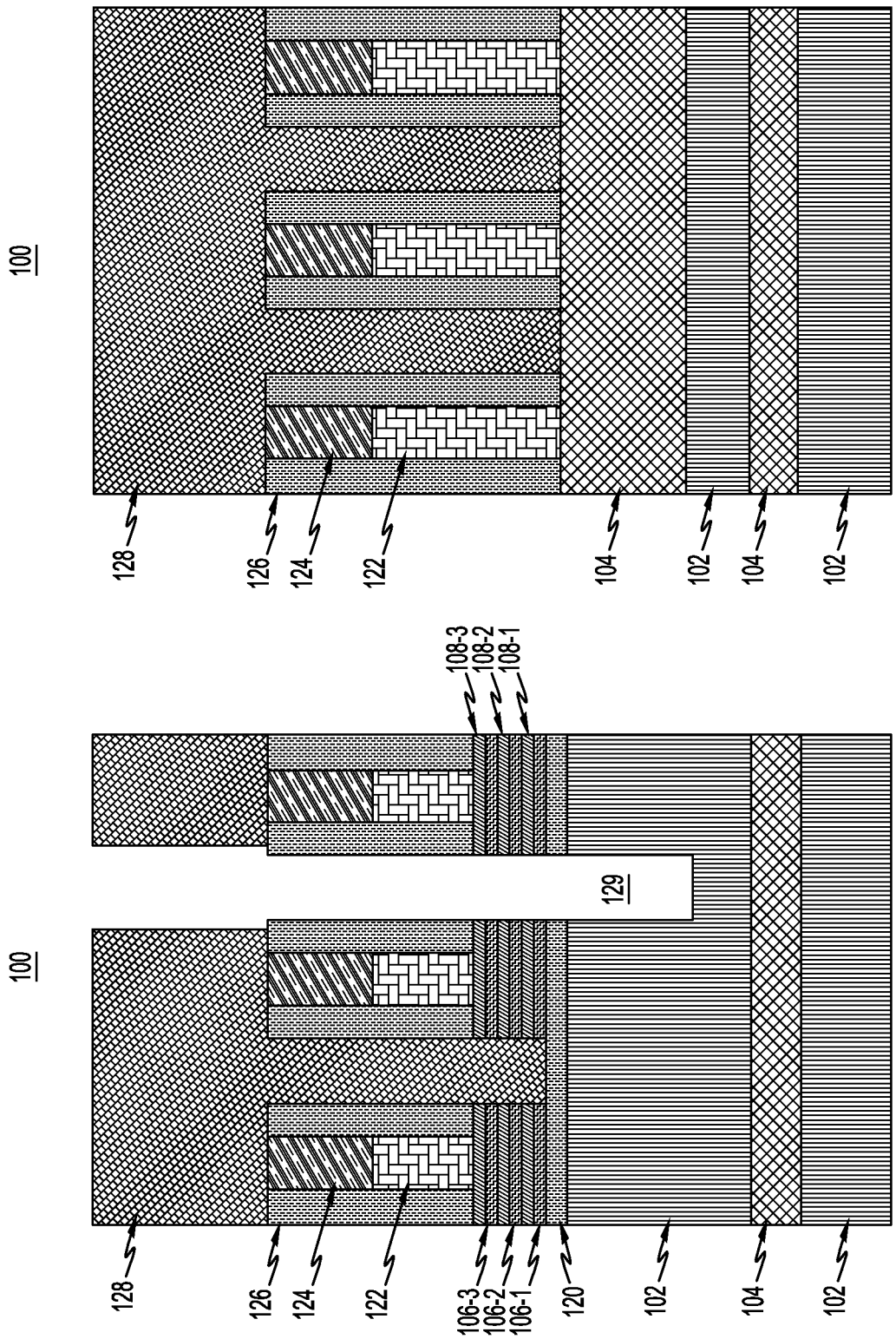

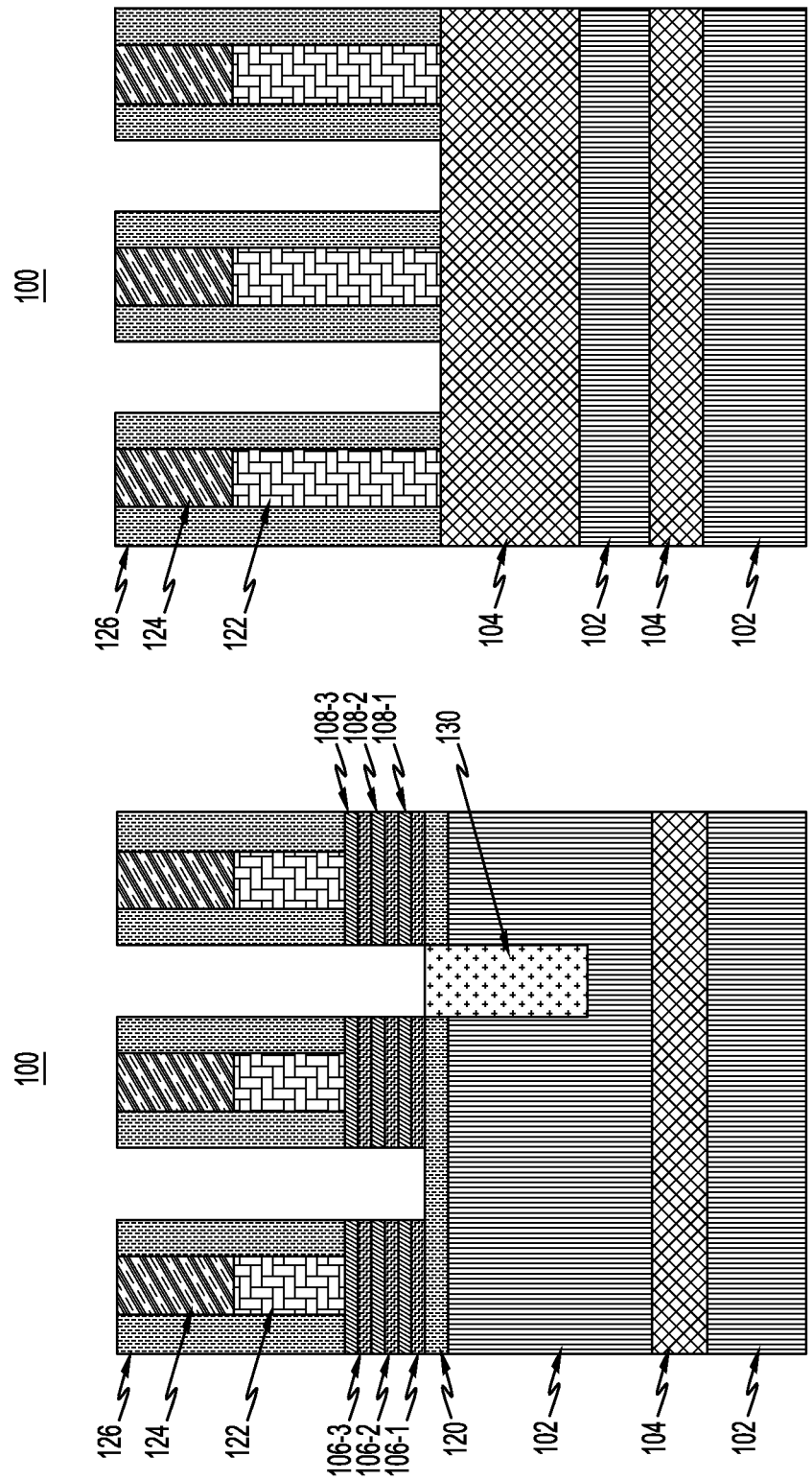

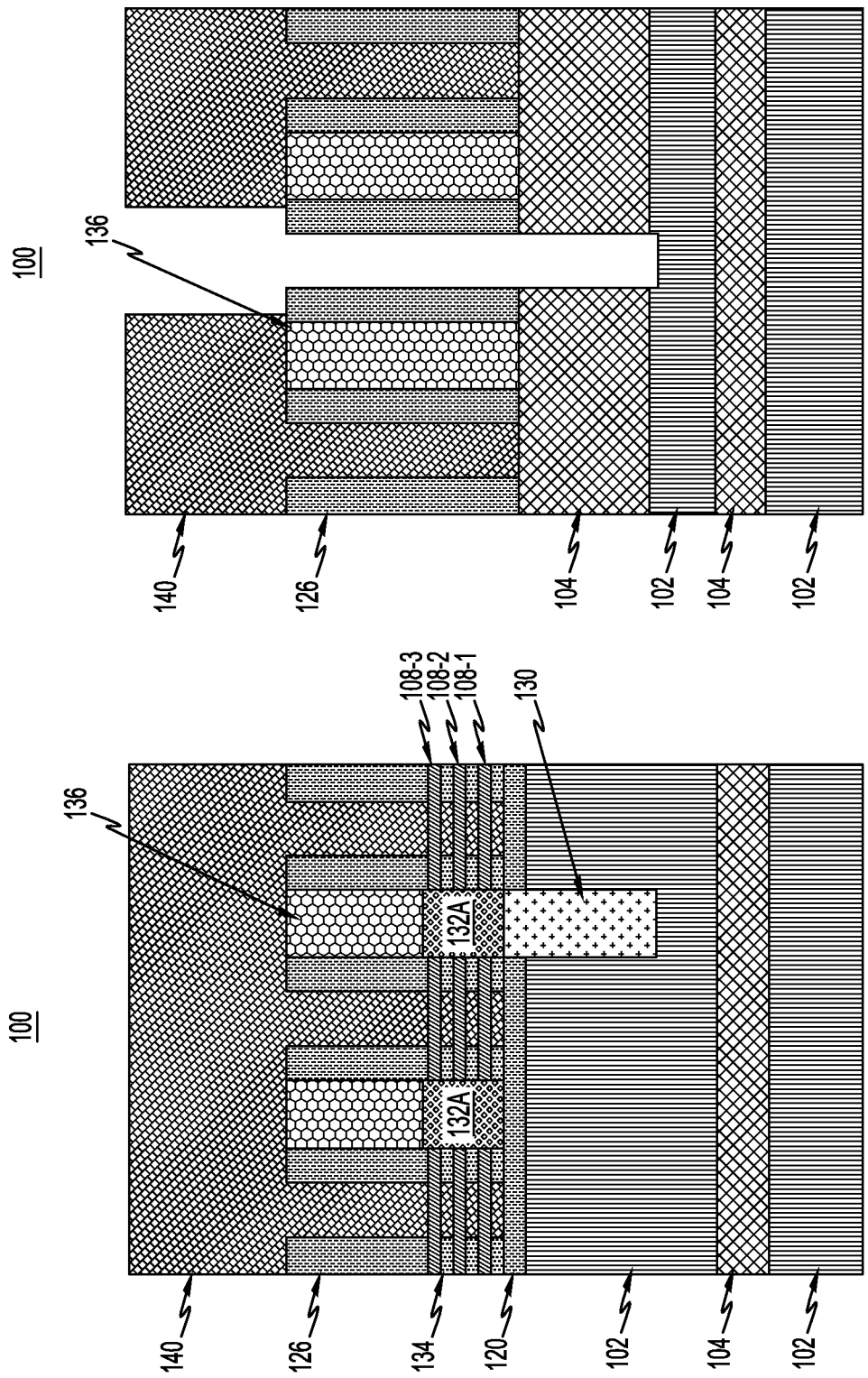

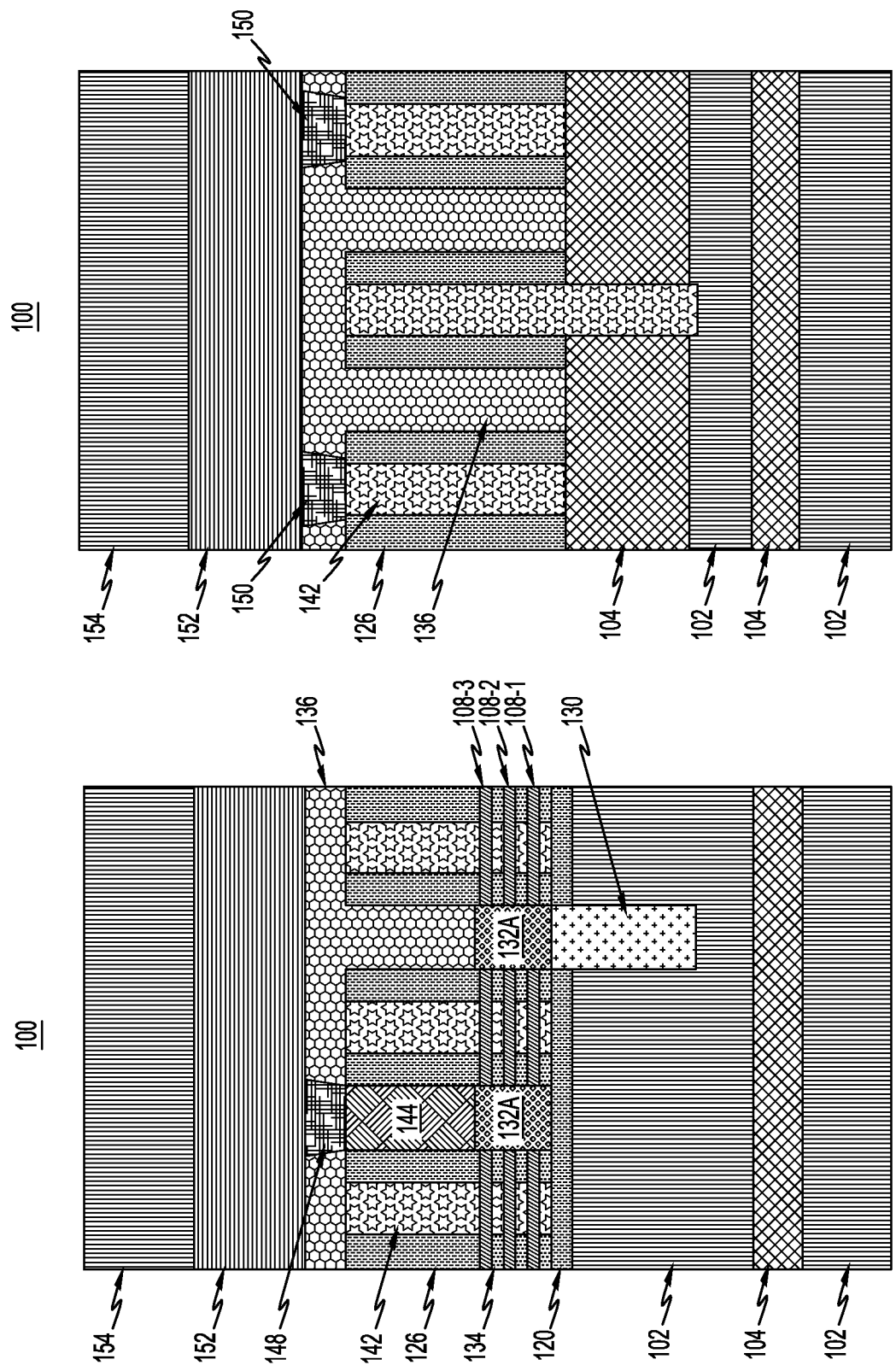

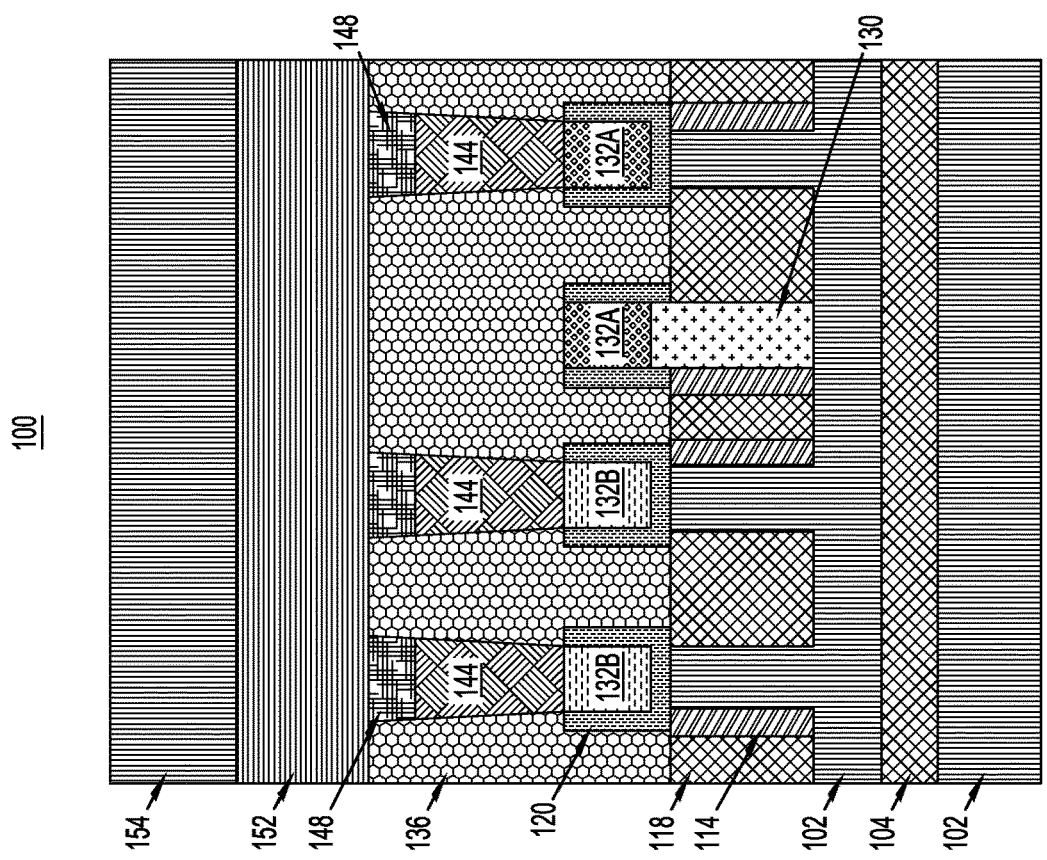
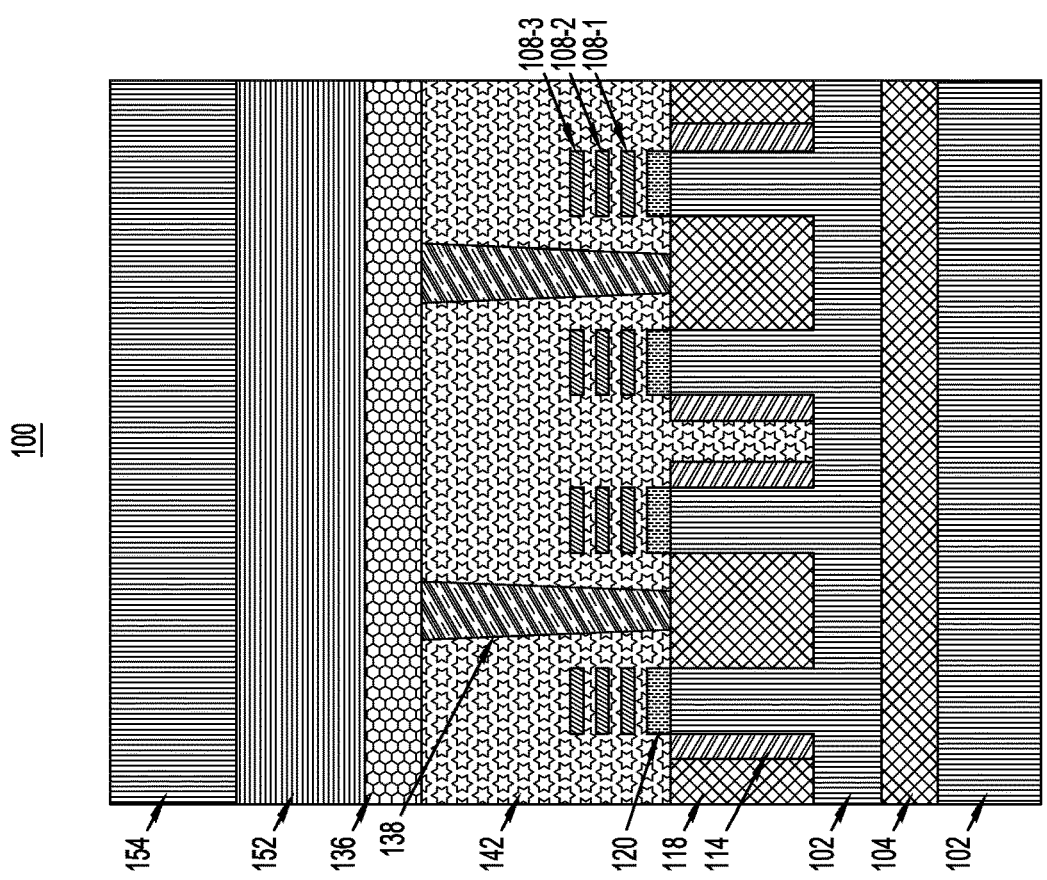
FIG. 12D
FIG. 12C

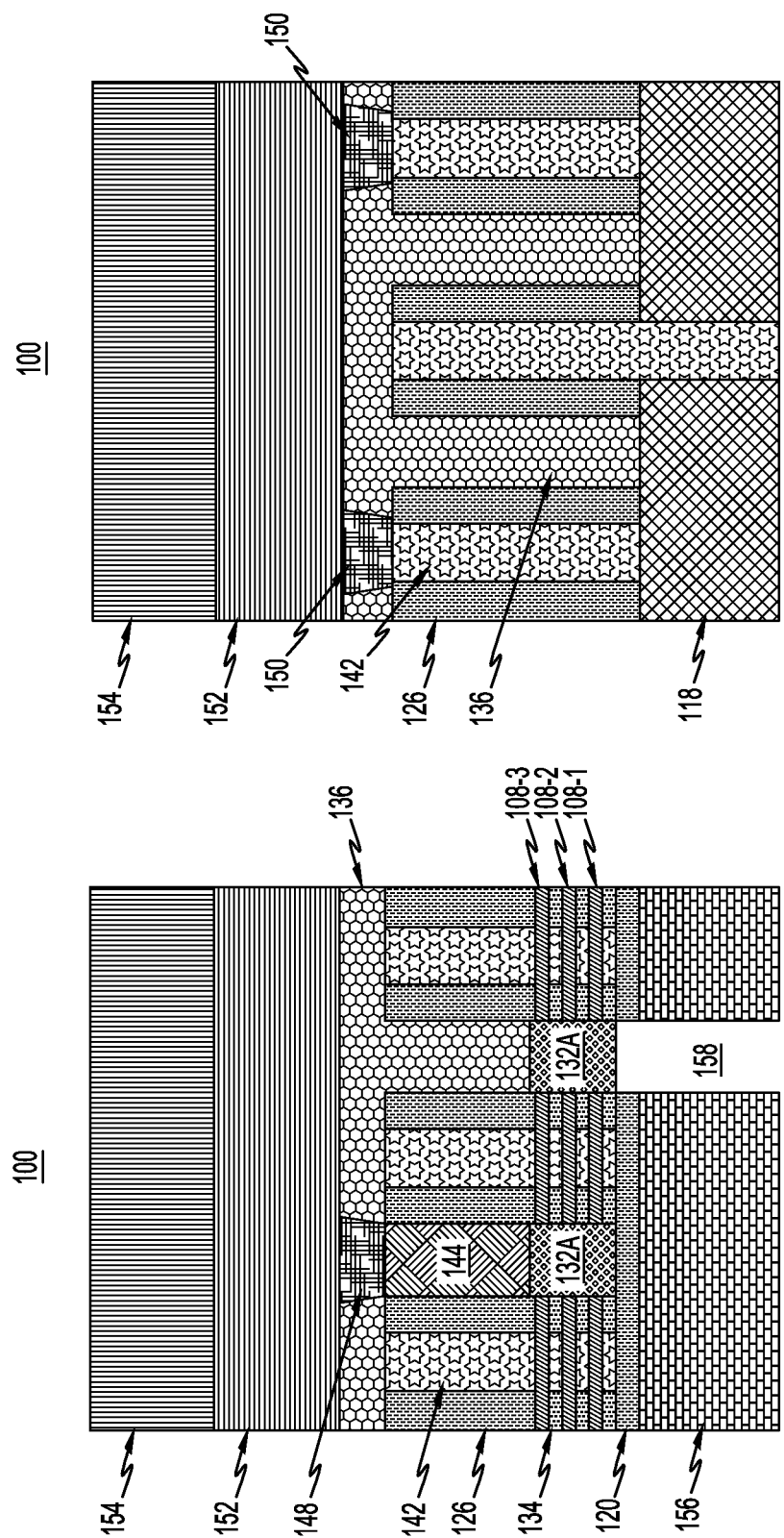

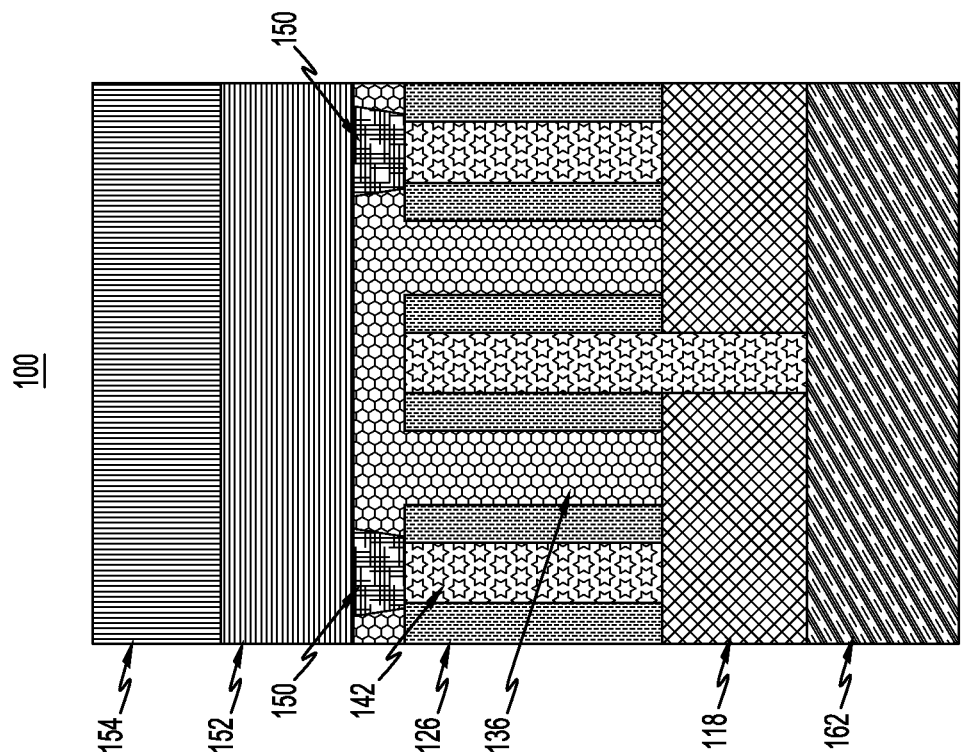
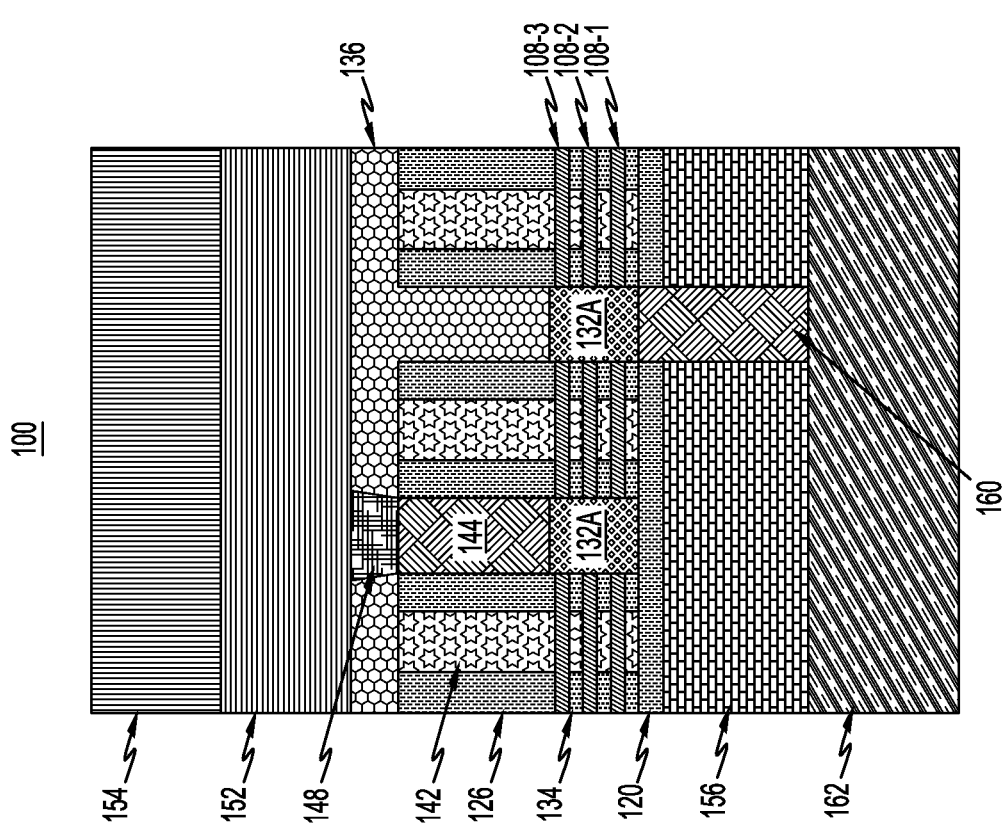
FIG. 17A
FIG. 17B

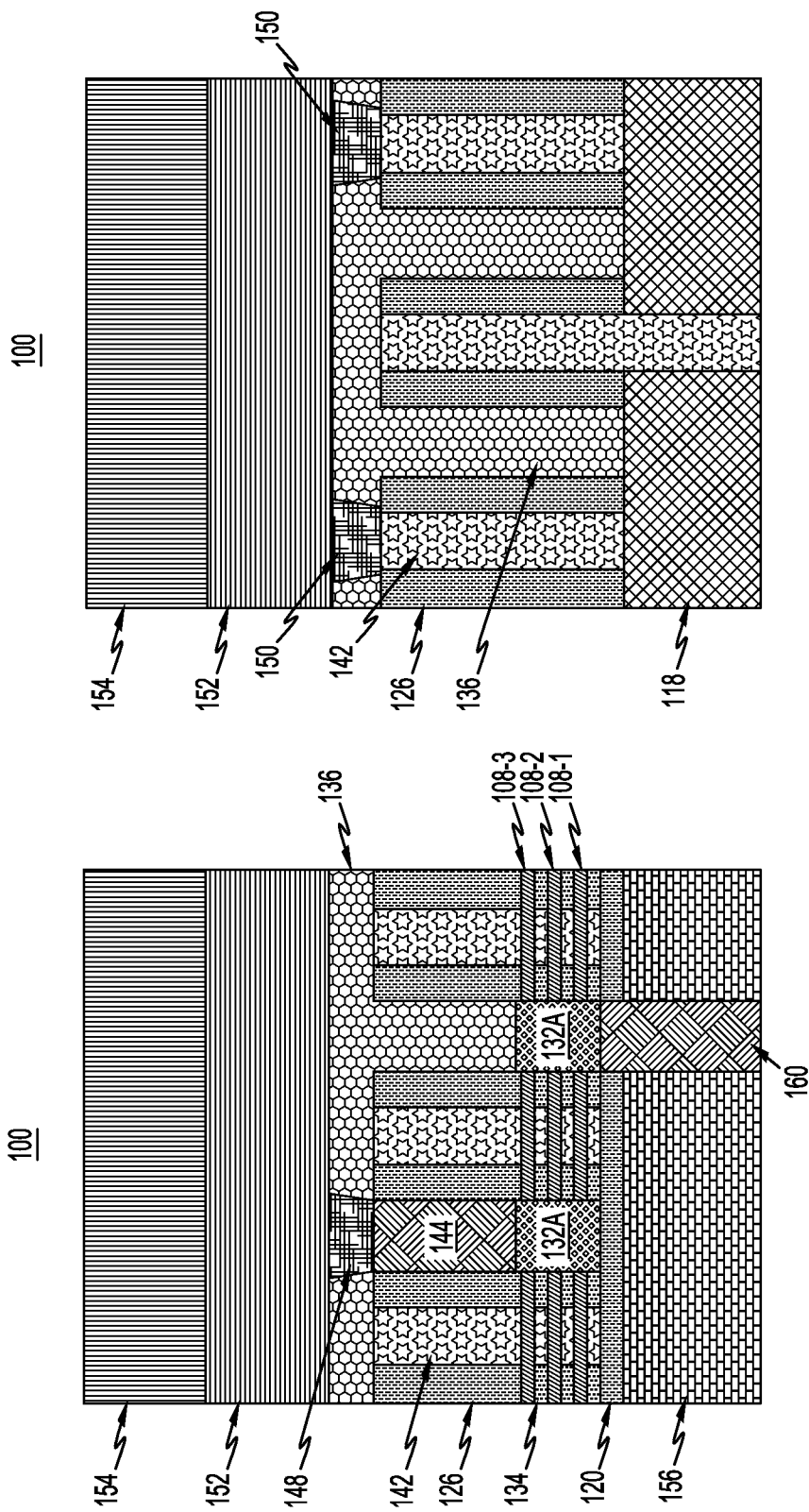

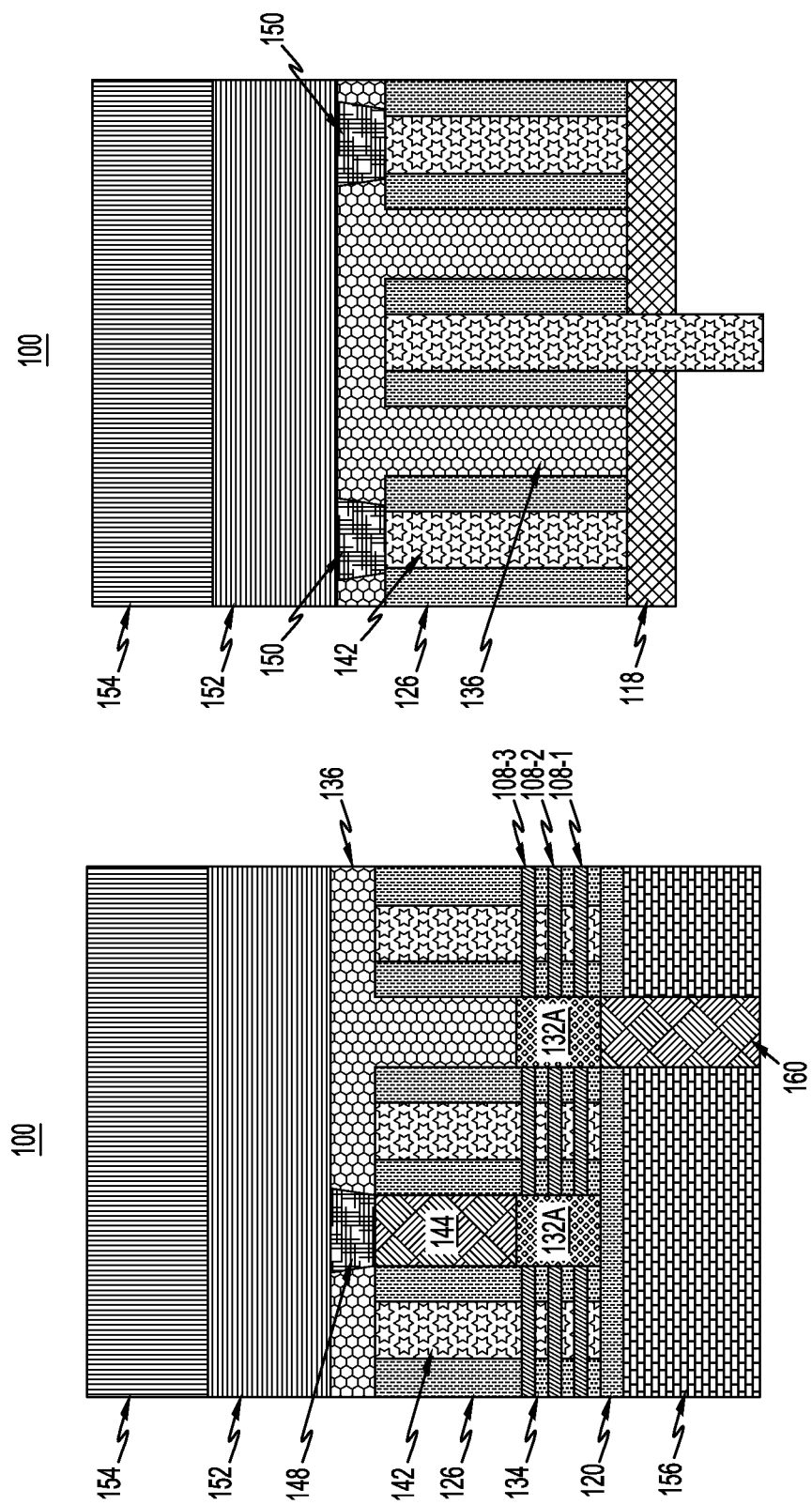

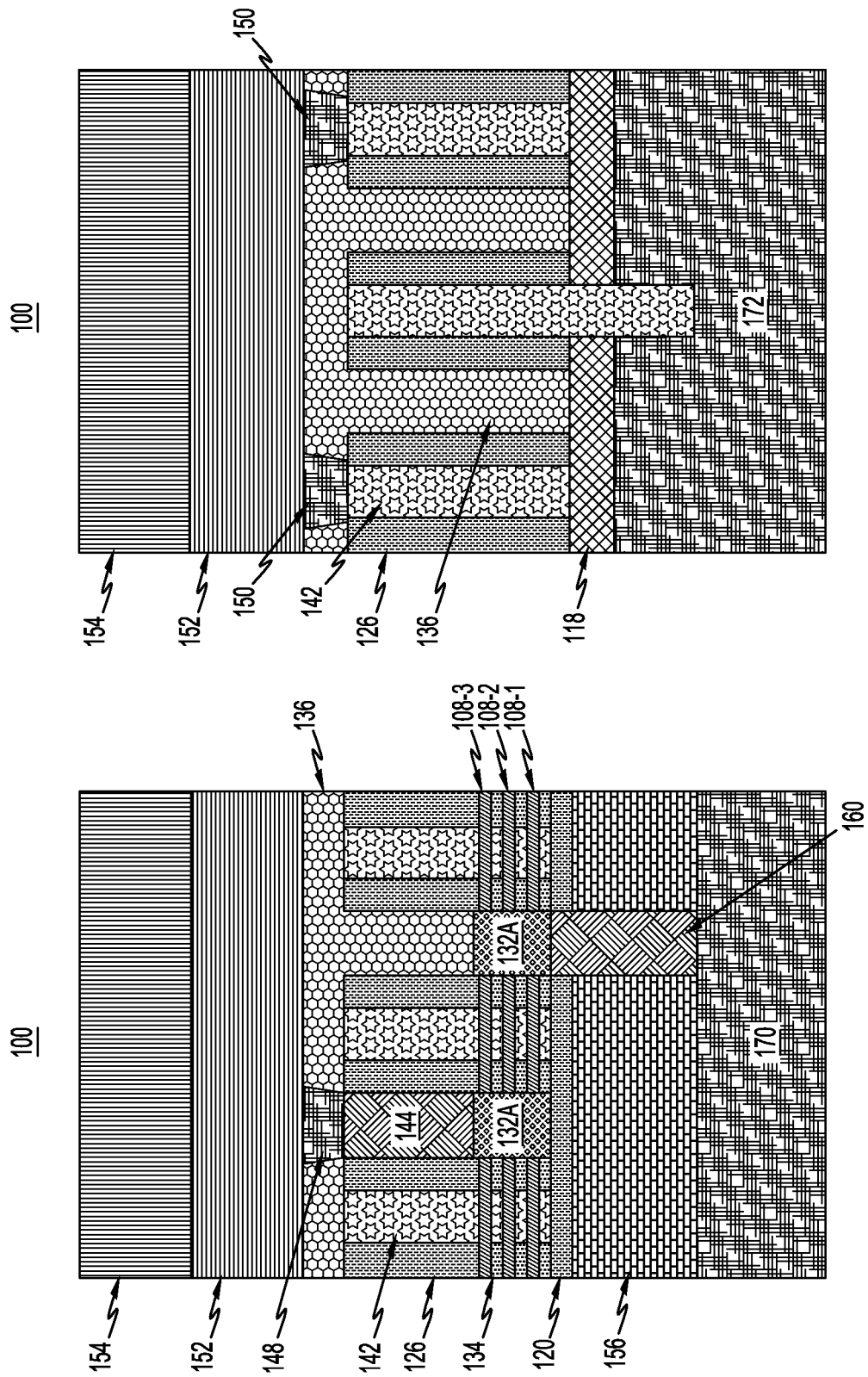

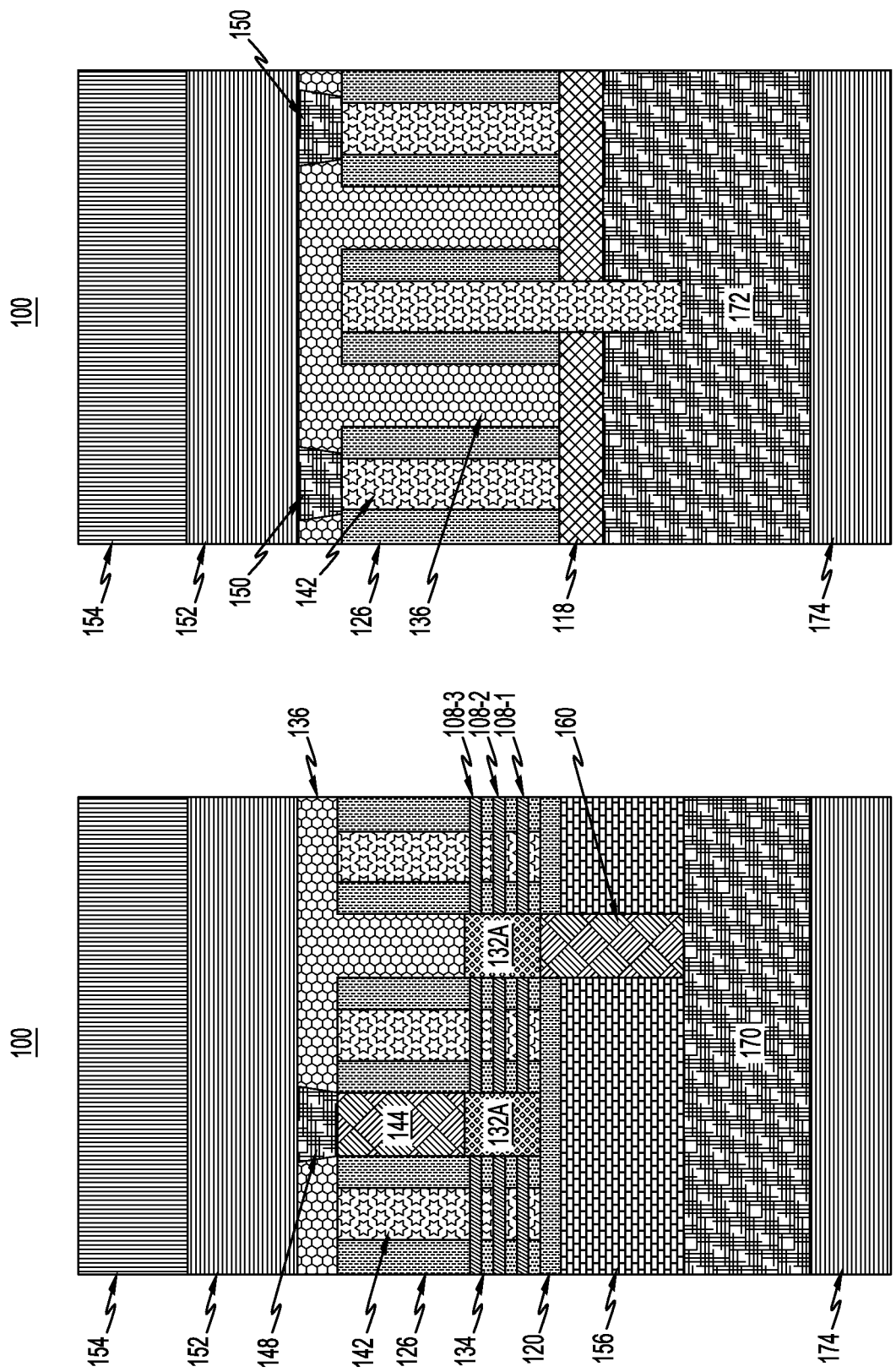

TRANSISTORS WITH BACKSIDE SOURCE/DRAIN CONTACT AND SPACER

BACKGROUND

A field-effect transistor (FET) is a transistor having a source, a gate, and a drain, the operation of which depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

Illustrative embodiments of the present application include techniques for use in semiconductor manufacture. In an illustrative embodiment, a semiconductor structure comprises a first backside power rail disposed on a portion of a sidewall and a bottom surface of a backside source/drain contact, a first sidewall spacer disposed on another sidewall of the backside source/drain contact, and a backside signal line disposed on the first sidewall spacer and separated from the backside source/drain contact.

The semiconductor structure of the illustrative embodiment advantageously allows for backside source/drain contact formation and gate to backside signal line connection. A backside power rail is partially wrapped on one side of the backside source/drain contact to increase contact area. A sidewall spacer is disposed between the backside source/drain contact and the backside signal line such that the backside power line is separated from the backside signal line to prevent signal to power shorting.

In one or more additional illustrative embodiments, as may be combined with the preceding paragraphs, the backside signal line is disposed between the first sidewall spacer and a second sidewall spacer.

In one or more additional illustrative embodiments, as may be combined with the preceding paragraphs, the semiconductor structure further comprises a first interlayer dielectric layer disposed on the second sidewall spacer and separated from the backside signal line.

In one or more additional illustrative embodiments, as may be combined with the preceding paragraphs, the semiconductor structure further comprises a second backside power rail, wherein the second backside power rail is separated from the backside signal line by a first interlayer dielectric layer and a second sidewall spacer.

In one or more additional illustrative embodiments, as may be combined with the preceding paragraphs, the first backside power rail, the second backside power rail and the backside signal line are disposed in a second interlayer dielectric layer.

In another illustrative embodiment, a semiconductor structure comprises a backside source/drain contact connected to a first backside power rail, and a gate structure connected to a backside signal line. The backside source/drain contact is separated from the backside signal line by a first sidewall spacer.

The semiconductor structure of the illustrative embodiment advantageously allows for backside source/drain contact formation and gate to backside signal line connection. A backside power rail is partially wrapped on one side of the backside source/drain contact to increase contact area. A sidewall spacer is disposed between the backside source/drain contact and the backside signal line such that the backside power line is separated from the backside signal line to prevent signal to power shorting.

In one or more additional illustrative embodiments, as may be combined with the preceding paragraphs, the first backside power rail is disposed on a portion of a sidewall and a bottom surface of the backside source/drain contact.

In one or more additional illustrative embodiments, as may be combined with the preceding paragraphs, the backside signal line is disposed between the first sidewall spacer and a second sidewall spacer.

In one or more additional illustrative embodiments, as may be combined with the preceding paragraphs, the semiconductor structure further comprises a first interlayer dielectric layer disposed on the second sidewall spacer and separated from the backside signal line.

In one or more additional illustrative embodiments, as may be combined with the preceding paragraphs, the semiconductor structure further comprises a second backside power rail.

In one or more additional illustrative embodiments, as may be combined with the preceding paragraphs, the second backside power rail is separated from the backside signal line by a first interlayer dielectric layer and a second sidewall spacer.

In one or more additional illustrative embodiments, as may be combined with the preceding paragraphs, the first backside power rail, the second backside power rail and the backside signal line are disposed in a second interlayer dielectric layer.

In one or more additional illustrative embodiments, as may be combined with the preceding paragraphs, the semiconductor structure further comprises a backside signal line via connecting the gate structure to the backside signal line.

In yet another illustrative embodiment, a semiconductor structure comprises a first nanosheet field-effect transistor device comprising a source/drain region and a first gate structure, a second nanosheet field-effect transistor device adjacent the first field-effect nanosheet transistor device, the second nanosheet field-effect transistor device comprising a second gate structure, a backside source/drain contact disposed on the source/drain region of the first nanosheet field-effect transistor device, a backside signal line disposed between the first nanosheet field-effect transistor device and the second nanosheet field-effect transistor device, a backside signal line via connecting the backside signal line to the first gate structure and the second gate structure, a first sidewall spacer disposed between the backside source/drain contact and the backside signal line, and a first backside power rail connected to the backside source/drain contact.

The semiconductor structure of the illustrative embodiment advantageously allows for backside source/drain contact formation and gate to backside signal line connection. A backside power rail is partially wrapped on one side of the backside source/drain contact to increase contact area. A sidewall spacer is disposed between the backside source/ drain contact and the backside signal line such that the backside power line is separated from the backside signal line to prevent signal to power shorting.

In one or more additional illustrative embodiments, as may be combined with the preceding paragraphs, the first backside power rail is disposed on a portion of a sidewall and a bottom surface of the backside source/drain contact.

In one or more additional illustrative embodiments, as may be combined with the preceding paragraphs, the backside signal line is disposed between the first sidewall spacer and a second sidewall spacer.

In one or more additional illustrative embodiments, as may be combined with the preceding paragraphs, the semiconductor structure further comprises a first interlayer dielectric layer disposed on the second sidewall spacer and separated from the backside signal line.

In one or more additional illustrative embodiments, as may be combined with the preceding paragraphs, the semiconductor structure further comprises a second backside power rail that is separated from the backside signal line by a first interlayer dielectric layer and a second sidewall spacer.

In one or more additional illustrative embodiments, as may be combined with the preceding paragraphs, the first backside power rail, the second backside power rail and the backside signal line are disposed in a second interlayer dielectric layer.

In one or more additional illustrative embodiments, as may be combined with the preceding paragraphs, the first nanosheet field-effect transistor device is a p-type nanosheet field-effect transistor device and the second nanosheet field-effect transistor device is an n-type nanosheet field-effect transistor device.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which:

FIG. 6A is a top view illustrating the semiconductor structure at a sixth-intermediate fabrication stage, according to an illustrative embodiment.

FIG. 6B is a cross-sectional view illustrating the semiconductor structure taken along the X1-X1 axis of FIG. 6A at the sixth-intermediate fabrication stage, according to an illustrative embodiment.

FIG. 6C is a cross-sectional view illustrating the semiconductor structure taken along the X2-X2 axis of FIG. 6A at the sixth-intermediate fabrication stage, according to an illustrative embodiment.

FIG. 7B is a cross-sectional view illustrating the semiconductor structure taken along the X1-X1 axis of FIG. 7A at the seventh-intermediate fabrication stage, according to an illustrative embodiment.

FIG. 7C is a cross-sectional view illustrating the semiconductor structure taken along the X2-X2 axis of FIG. 7A at the seventh-intermediate fabrication stage, according to an illustrative embodiment.

FIG. 8A is a cross-sectional view illustrating the semiconductor structure taken along the X1-X1 axis of FIG. 7A at an eighth-intermediate fabrication stage, according to an illustrative embodiment.

FIG. 8B is a cross-sectional view illustrating the semiconductor structure taken along the X2-X2 axis of FIG. 7A at the eighth-intermediate fabrication stage, according to an illustrative embodiment.

FIG. 10A is a cross-sectional view illustrating the semiconductor structure taken along the X1-X1 axis of FIG. 7A at a tenth-intermediate fabrication stage, according to an illustrative embodiment.

FIG. 10B is a cross-sectional view illustrating the semiconductor structure taken along the X2-X2 axis of FIG. 7A at the tenth-intermediate fabrication stage, according to an illustrative embodiment.

FIG. 12A is a cross-sectional view illustrating the semiconductor structure taken along the X1-X1 axis of FIG. 7A at a twelfth-intermediate fabrication stage, according to an illustrative embodiment.

FIG. 12B is a cross-sectional view illustrating the semiconductor structure taken along the X2-X2 axis of FIG. 7A at the twelfth-intermediate fabrication stage, according to an illustrative embodiment.

FIG. 12C is a cross-sectional view illustrating the semiconductor structure taken along the Y1-Y1 axis of FIG. 7A at the twelfth-fabrication stage, according to an illustrative embodiment.

FIG. 12D is a cross-sectional view illustrating the semiconductor structure taken along the Y2-Y2 axis of FIG. 7A at the twelfth-intermediate fabrication stage, according to an illustrative embodiment.

FIG. 15A is a cross-sectional view illustrating the semiconductor structure taken along the X1-X1 axis of FIG. 7A at a fifteenth-intermediate fabrication stage, according to an illustrative embodiment.

FIG. 15B is a cross-sectional view illustrating the semiconductor structure taken along the X2-X2 axis of FIG. 7A at the fifteenth-intermediate fabrication stage, according to an illustrative embodiment.

FIG. 17A is a cross-sectional view illustrating the semiconductor structure taken along the X1-X1 axis of FIG. 7A at a seventeenth-intermediate fabrication stage, according to an illustrative embodiment.

FIG. 17B is a cross-sectional view illustrating the semiconductor structure taken along the X2-X2 axis of FIG. 7A at the seventeenth-intermediate fabrication stage, according to an illustrative embodiment.

FIG. 18A is a cross-sectional view illustrating the semiconductor structure taken along the X1-X1 axis of FIG. 7A at an eighteenth-intermediate fabrication stage, according to an illustrative embodiment.

FIG. 18B is a cross-sectional view illustrating the semiconductor structure taken along the X2-X2 axis of FIG. 7A at the eighteenth-intermediate fabrication stage, according to an illustrative embodiment.

FIG. 19A is a cross-sectional view illustrating the semiconductor structure taken along the X1-X1 axis of FIG. 7A at a nineteenth-intermediate fabrication stage, according to an illustrative embodiment.

FIG. 19B is a cross-sectional view illustrating the semiconductor structure taken along the X2-X2 axis of FIG. 7A at the nineteenth-intermediate fabrication stage, according to an illustrative embodiment.

FIG. 20B is a cross-sectional view illustrating the semiconductor structure taken along the X1-X1 axis of FIG. 20A at the twentieth-intermediate fabrication stage, according to an illustrative embodiment.

FIG. 20C is a cross-sectional view illustrating the semiconductor structure taken along the X2-X2 axis of FIG. 20A at the twentieth-fabrication stage, according to an illustrative embodiment.

FIG. 21A is a cross-sectional view illustrating the semiconductor structure taken along the X1-X1 axis of FIG. 20A at a twenty first-intermediate fabrication stage, according to an illustrative embodiment.

FIG. 21B is a cross-sectional view illustrating the semiconductor structure taken along the X2-X2 axis of FIG. 20A at the twenty first-intermediate fabrication stage, according to an illustrative embodiment.

DETAILED DESCRIPTION

Figure 1:
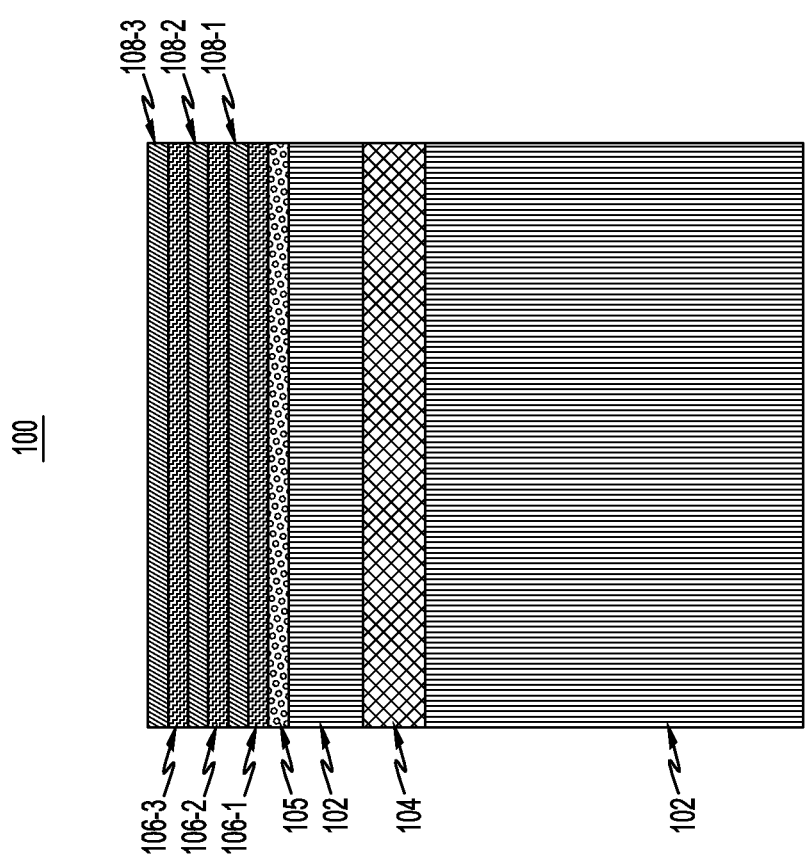
FIG. 1 is a cross-sectional view illustrating a semiconductor structure at a first-intermediate fabrication stage, according to an illustrative embodiment.

Various illustrative embodiments of the invention may be described herein in the context of illustrative methods for forming a semiconductor structure having at least a backside source/drain contact with a backside power rail partially wrapped on one side and a sidewall spacer on the other side to separate the backside power rail from a backside signal line to prevent signal to power shorting, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

When forming a backside source/drain contact and backside signal line nearby, in order to prevent a short from the backside power rail to backside signal line, only half of the power rail is contacted with the backside source/drain contact, which increases the contact resistance. Illustrative embodiments provide methods and structures for overcoming the foregoing drawback by extending the backside source/drain contact and backside signal line contact area when connecting to the backside power rail and backside signal line to reduce contact resistance.

Referring now to the drawings in which like numerals represent the same of similar elements, FIGS. 1-21D illustrate various processes for fabricating a semiconductor structure. Note that the same reference numeral (100) is used to denote the semiconductor structure through the various intermediate fabrication stages illustrated in FIGS. 1-21D. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1-21D are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

FIG. 1 shows semiconductor structure 100 at a first-intermediate fabrication stage. Semiconductor structure 100 includes substrate 102. Substrate 102 may be formed of any suitable semiconductor material, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

An etch stop layer 104 is formed in the substrate 102. The etch stop layer 104 may comprise a buried oxide (BOX) layer or silicon germanium (SiGe), or another suitable material such as a III-V semiconductor epitaxial layer.

Nanosheets are initially formed over the substrate 102, where the nanosheets include sacrificial layer 105, sacrificial layers 106-1, 106-2 and 106-3 (collectively, sacrificial layers 106), and nanosheet channel layers 108-1, 108-2 and 108-3 (collectively, nanosheet channel layers 108). The sacrificial layers 105 and 106 are illustratively formed of different sacrificial materials, such that they may be etched or otherwise removed selective to one another. In some embodiments, the sacrificial layers are formed of SiGe, but with different percentages of Ge. For example, certain ones of the sacrificial layers may have a relatively higher percentage of Ge (e.g., 55% Ge), and other ones of the sacrificial layers may have a relatively lower percentage of Ge (e.g., 25% Ge). Other combinations of different sacrificial materials may be used in other embodiments. The nanosheet channel layers 108 may be formed of Si or another suitable material (e.g., a material similar to that used for the substrate 102).

Figure 2:
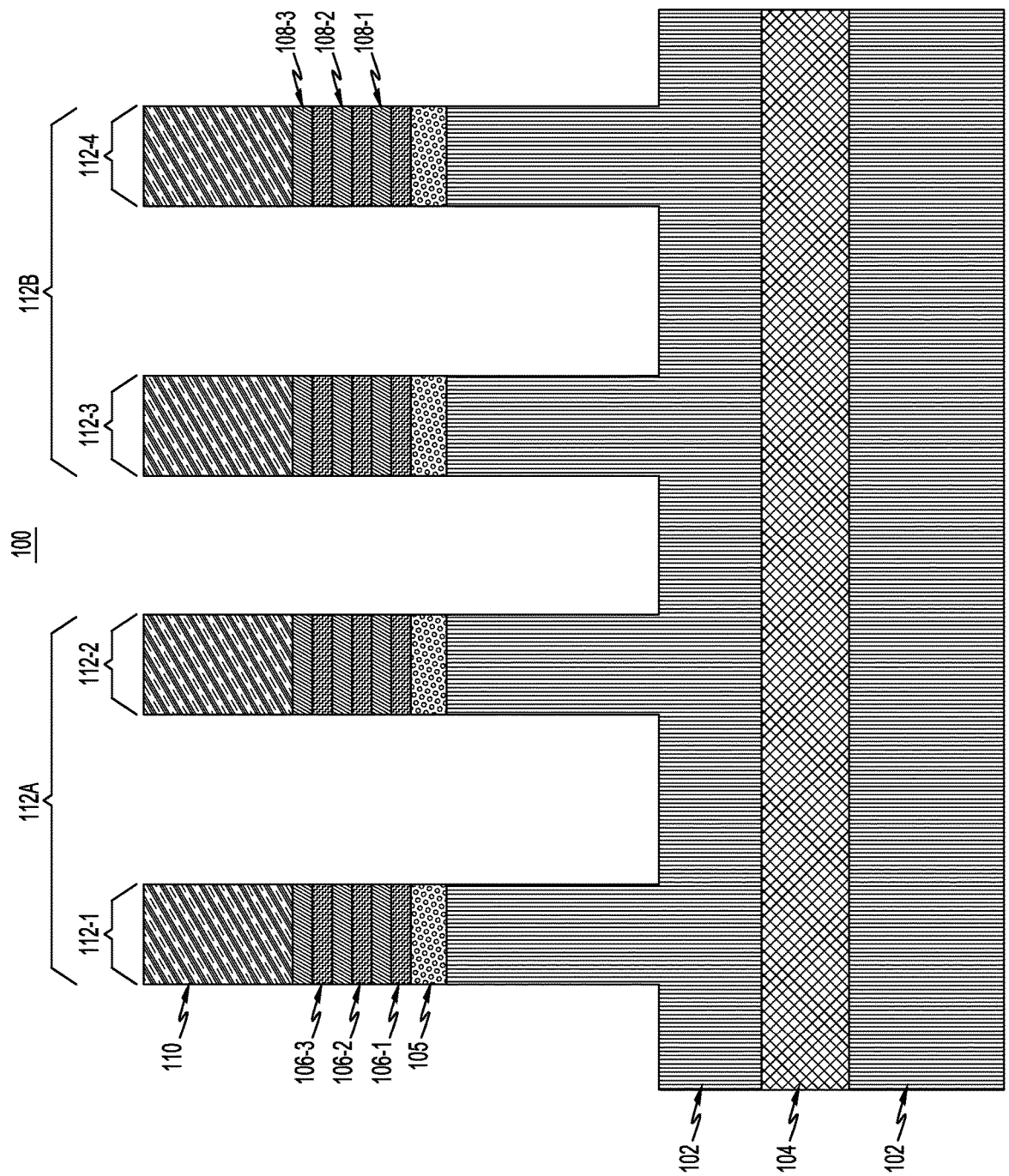
FIG. 2 is a cross-sectional view illustrating the semiconductor structure at a second-intermediate fabrication stage, according to an illustrative embodiment.

FIG. 2 illustrates semiconductor structure 100 at a second-intermediate fabrication stage. During this stage, the nanosheets are then patterned for formation of shallow trench isolation (STI) regions discussed hereinbelow and two FET stack sets 112A and 112B, i.e., a first FET stack set 112A contains FET stacks 112-1 and 112-2 and a second FET stack set 112B contains FET stacks 112-3 and 112-4. Each of FET stacks 112-1 through 112-4 contain a FET device. The FET devices may comprise an nFET device or a pFET device and other FET devices may comprise a pFET device or an nFET device. In an illustrative embodiment, a first set of FET stacks 112-1 and 112-2 are nFET-type devices and a second set of FET stacks 112-3 and 112-4 are pFET-type devices. In addition, although two FET stack sets 112A and 112B, i.e., a first set of FET stacks 112-1 and 112-2 and a second set of FET stacks 112-3 and 112-4 are shown, the number of sets of FET stacks should not be considered limiting and any number are contemplated.

The FET stacks 112-1 through 112-4 may be formed by first depositing a hardmask layer 110 on the topmost nanosheet channel layer 108-3. The material of the hardmask layer 110 may include SiN, a multi-layer of SiN and SiO$_2$, or another suitable material. Next, FET stacks 112-1 through 112-4 are formed using, for example, an anisotropic etch such as reactive ion etching (RIE) that selectively removes the nanosheet layers and extending into the substrate 102 in regions that are not protected by hardmask layer 110. As used herein, the term "selective" in reference to a material removal process denotes that the rate of material removal for a first material is greater than the rate of removal for at least another material of the structure to which the material removal process is being applied.

Figure 3:
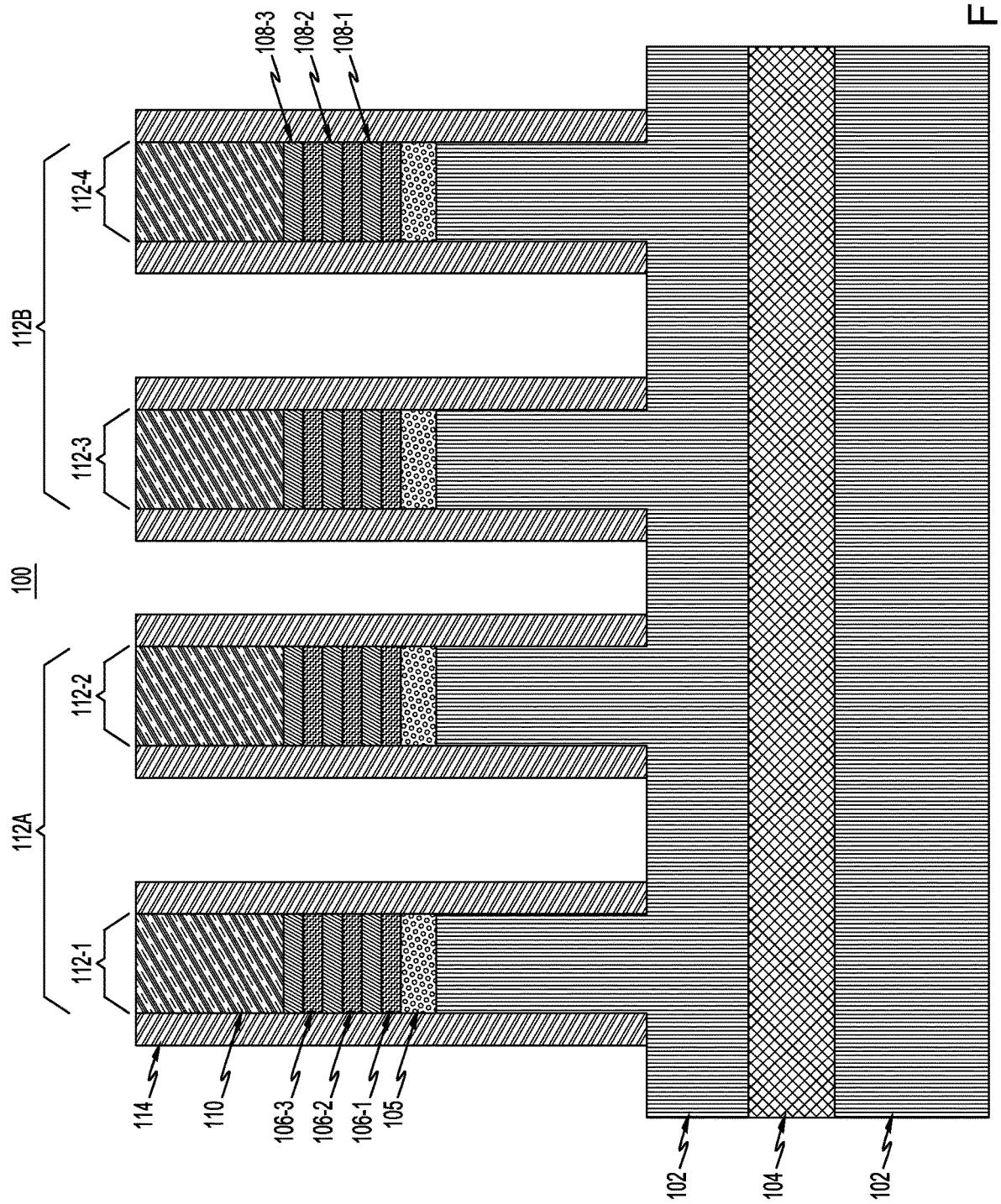
FIG. 3 is a cross-sectional view illustrating the semiconductor structure at a third-intermediate fabrication stage, according to an illustrative embodiment.

FIG. 3 illustrates semiconductor structure 100 at a third-intermediate fabrication stage. During this stage, sidewall spacers 114 are formed by conformal dielectric liner deposition and anisotropic dielectric liner etching. Sidewall spacers 114 may be formed of any suitable insulator, such as SiN, silicon boron carbide nitride (SiBCN), silicon oxycarbonitride (SiOCN), etc.

Figure 4:
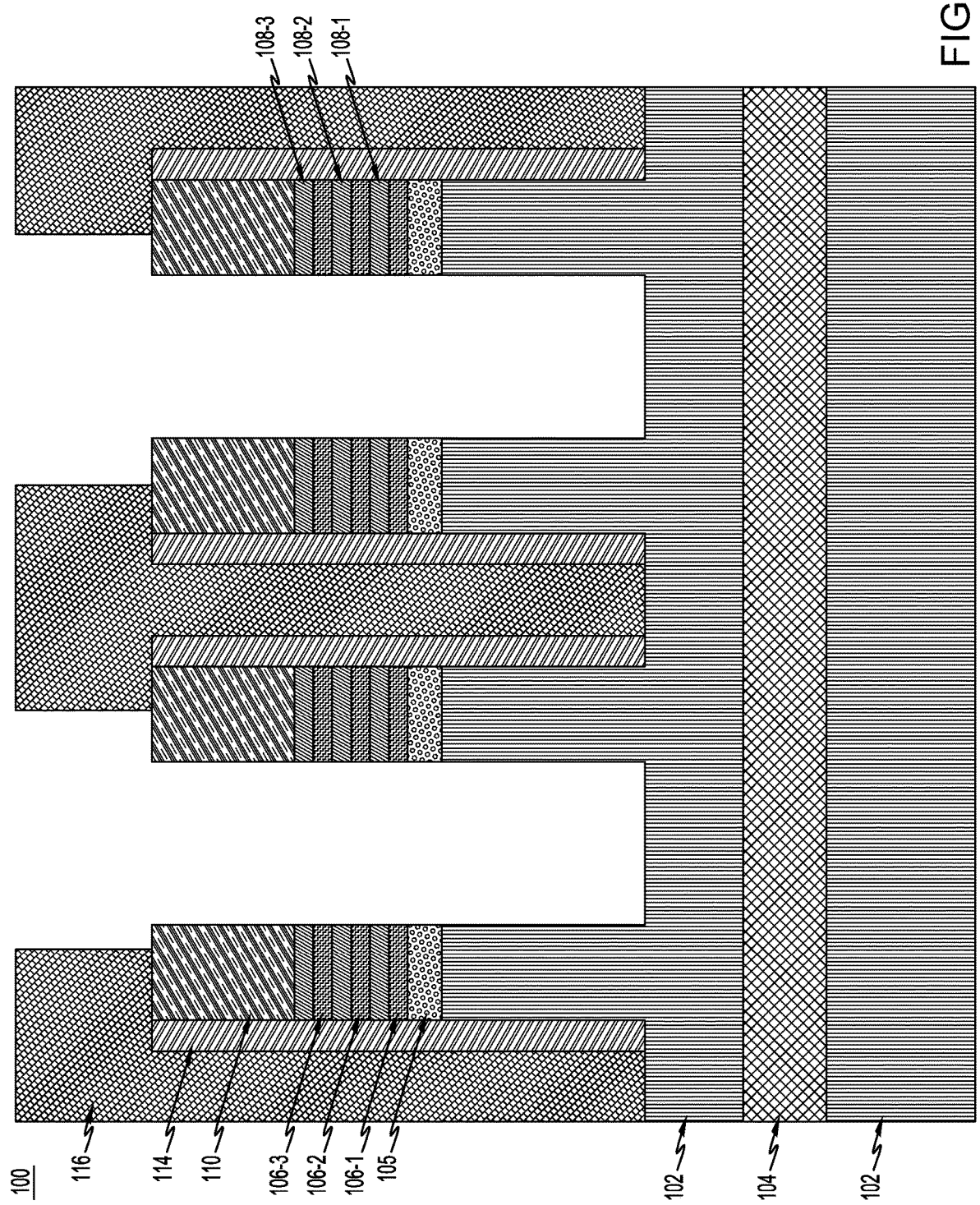
FIG. 4 is a cross-sectional view illustrating the semiconductor structure at a fourth-intermediate fabrication stage, according to an illustrative embodiment.

FIG. 4 illustrates semiconductor structure 100 at a fourth-intermediate fabrication stage. During this stage, a masking layer 116 (e.g., an organic planarization layer (OPL)) is first deposited, e.g., by spin-on coating, onto the semiconductor structure 100 and is baked at a suitable temperate ranging from about 100° C. to about 400° C. Masking layer 116 can be composed of a flowable organic material such as, for example, a spin-on-carbon (SOC). In illustrative embodiments, masking layer 116 is self-leveling and can achieve planarization over the surface topography without the use of etching, CMP, or other conventional planarization techniques. In illustrative embodiments, masking layer 116 may require multiple deposition processes, etching processes or optionally a CMP process to planarize masking layer 116.

Following deposition, masking layer 116 is subjected to a trench or opening patterning procedure, e.g., conventional lithographic and etching processes utilizing, e.g., a reactive ion etching (RIE) process (with, e.g., a halogen-based plasma chemistry) to remove at least a segment of masking layer 116 and sidewall spacers 114 on opposing sidewalls of FET stacks 112-1 and 112-2 of first FET stack set 112A and opposing sidewalls of FET stacks 112-3 and 112-4 of second FET stack set 112B thereby forming an opening therein.

Figure 5:
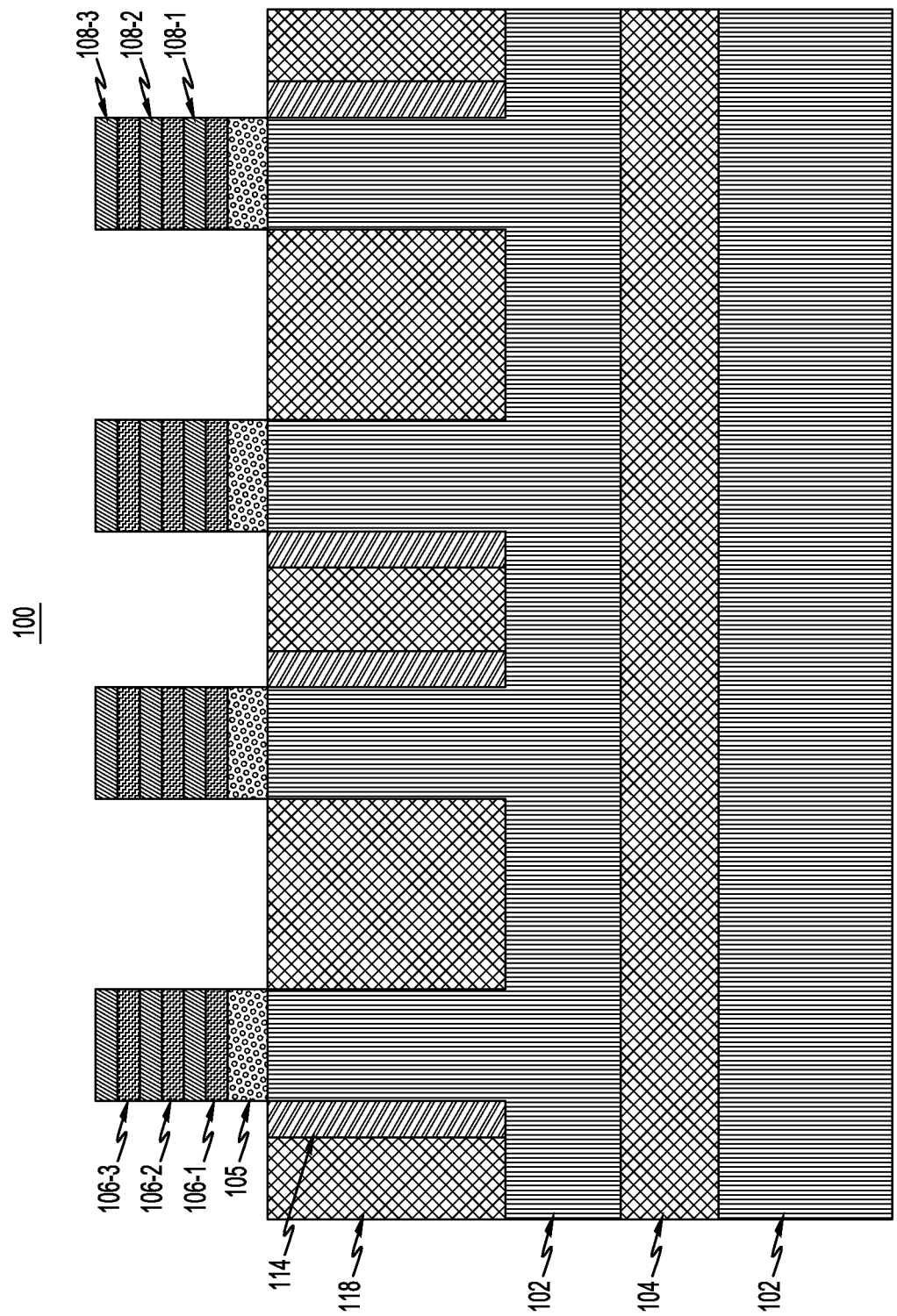
FIG. 5 is a cross-sectional view illustrating the semiconductor structure at a fifth-intermediate fabrication stage, according to an illustrative embodiment.
Figure 6D:
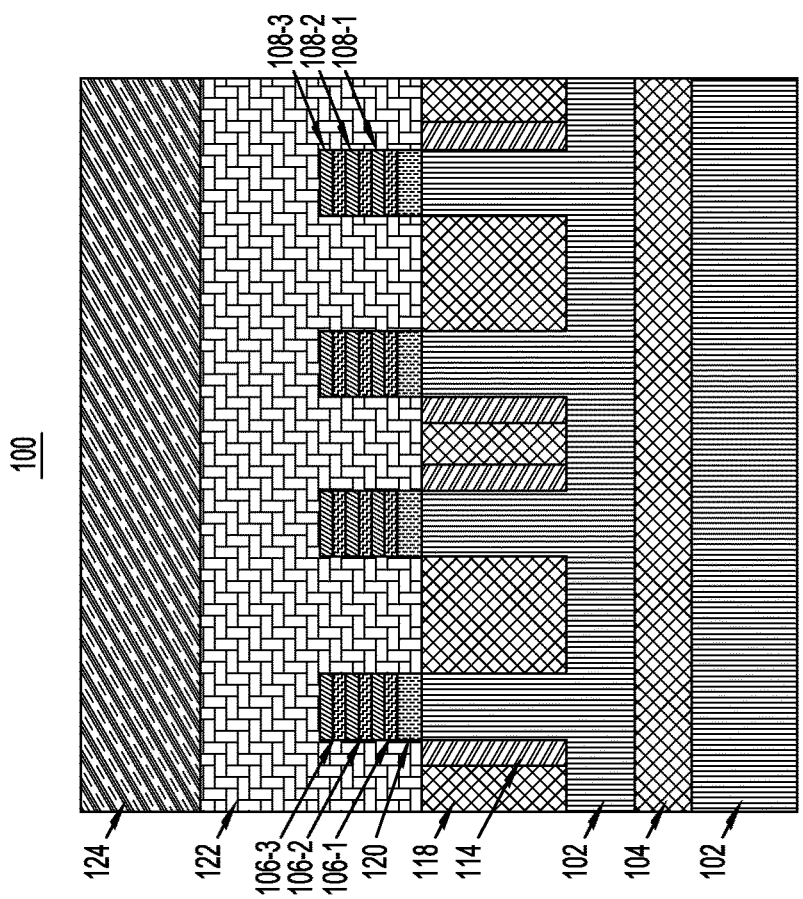
FIG. 6D is a cross-sectional view illustrating the semiconductor structure taken along the Y1-Y1 axis of FIG. 6A at the sixth-intermediate fabrication stage, according to an illustrative embodiment.
Figure 6E:
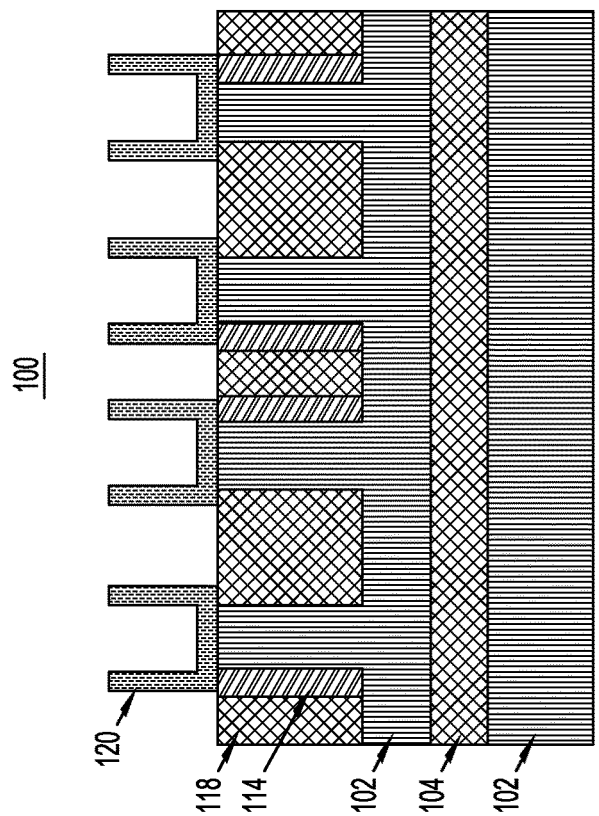
FIG. 6E is a cross-sectional view illustrating the semiconductor structure taken along the Y2-Y2 axis of FIG. 6A at the sixth-intermediate fabrication stage, according to an illustrative embodiment.
Figure 7A:
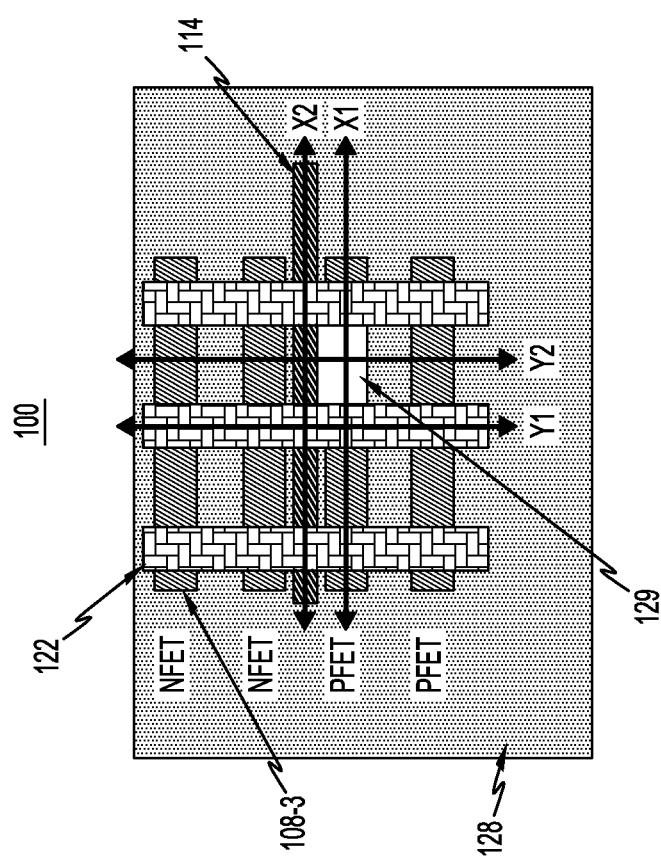
FIG. 7A is a top view illustrating the semiconductor structure at a seventh-intermediate fabrication stage, according to an illustrative embodiment.
Figure 7E:
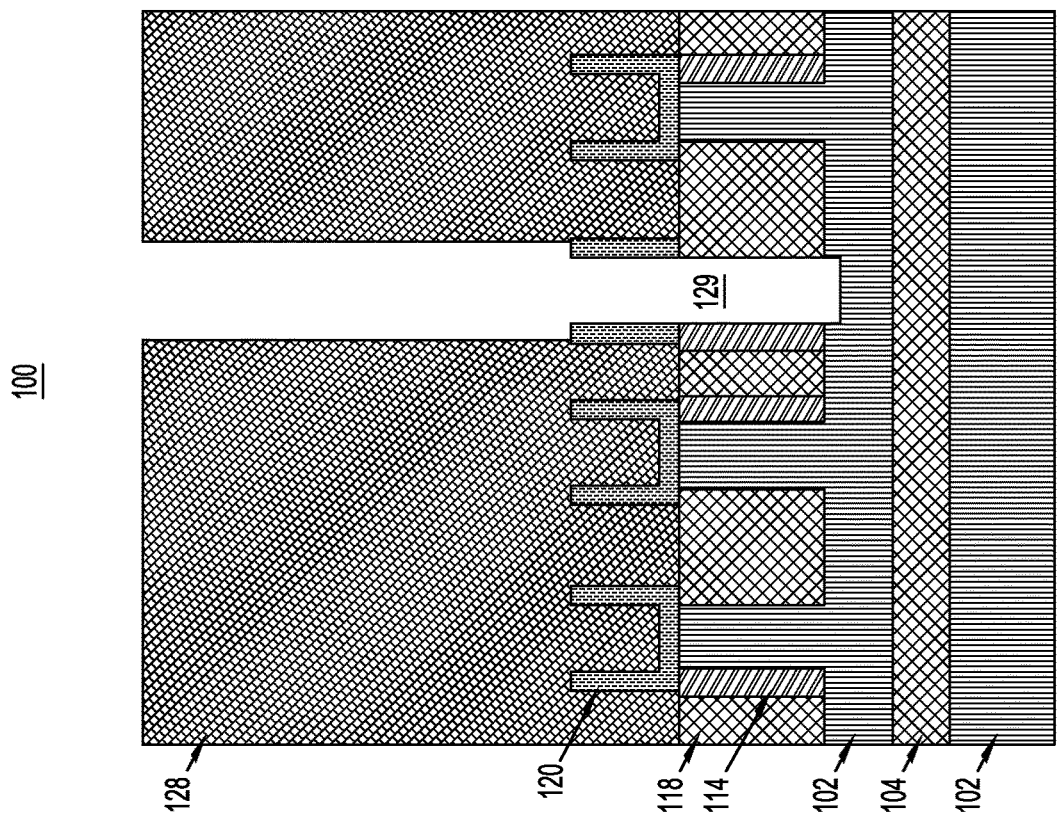
FIG. 7E is a cross-sectional view illustrating the semiconductor structure taken along the Y2-Y2 axis of FIG. 7A at the seventh-intermediate fabrication stage, according to an illustrative embodiment.
Figure 7D:
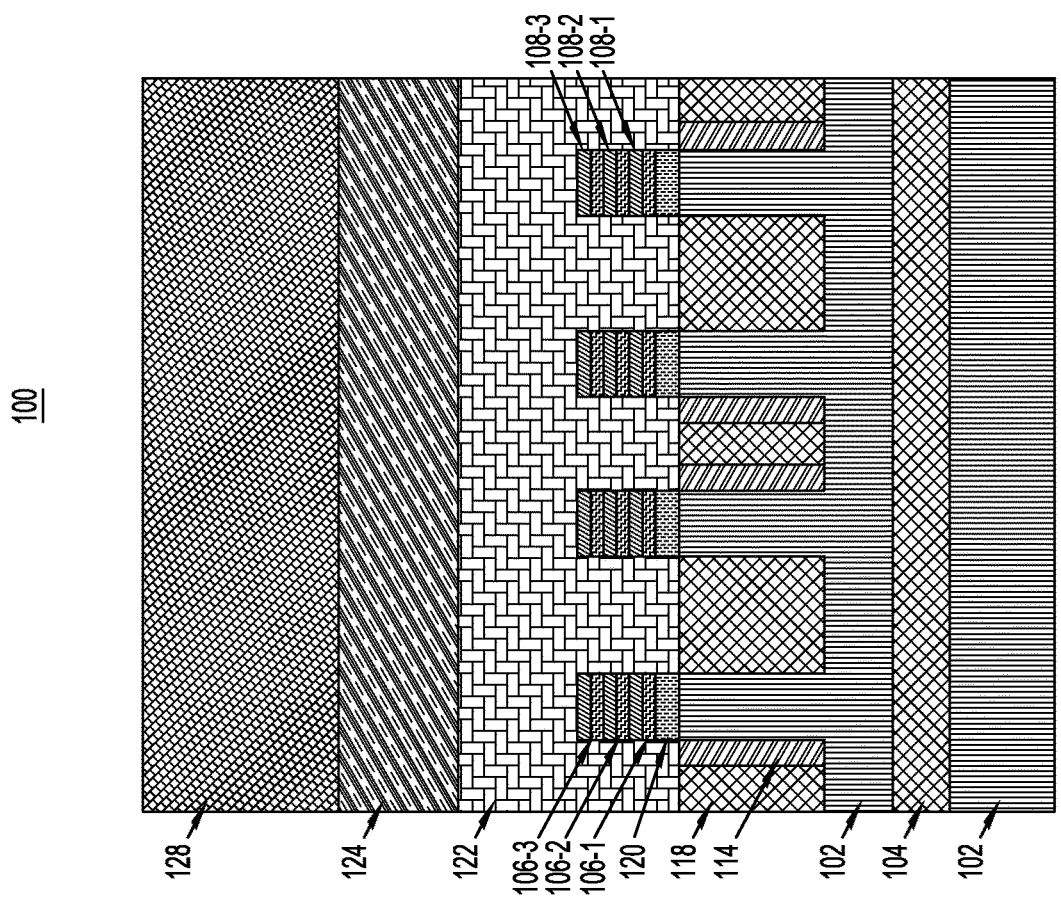
FIG. 7D is a cross-sectional view illustrating the semiconductor structure taken along the Y1-Y1 axis of FIG. 7A at the seventh-intermediate fabrication stage, according to an illustrative embodiment.
Figure 8C:
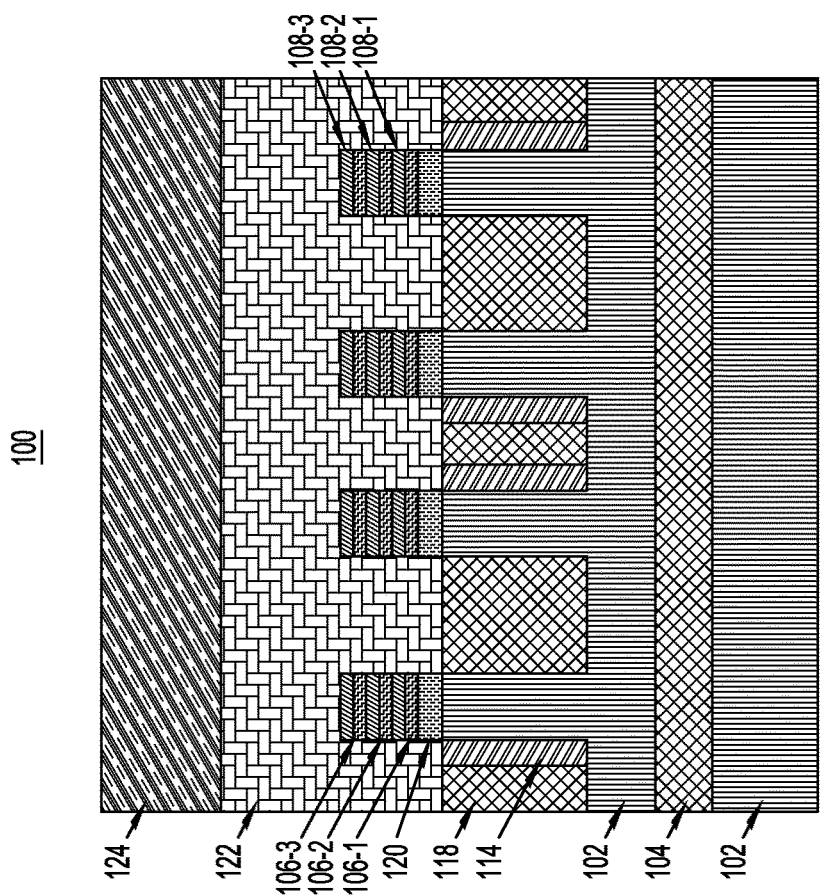
FIG. 8C is a cross-sectional view illustrating the semiconductor structure taken along the Y1-Y1 axis of FIG. 7A at the eighth-intermediate fabrication stage, according to an illustrative embodiment.
Figure 8D:
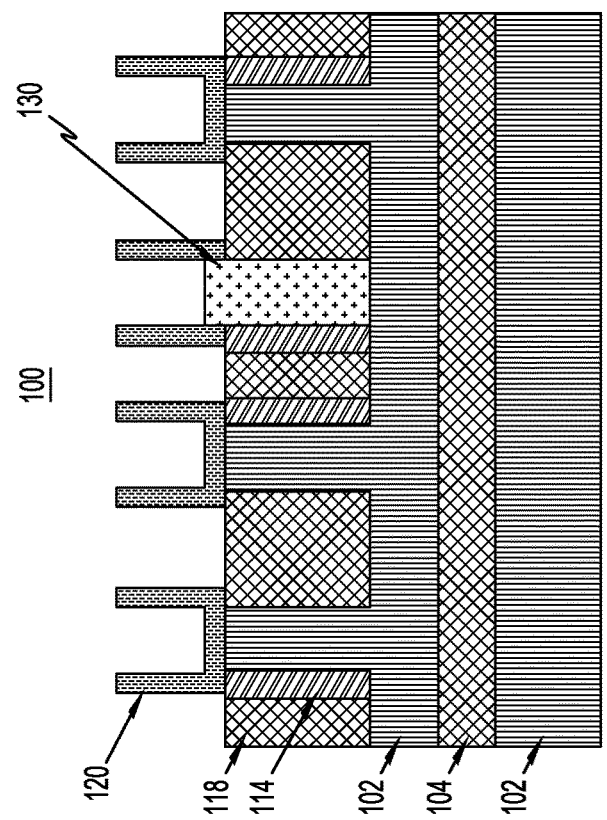
FIG. 8D is a cross-sectional view illustrating the semiconductor structure taken along the Y2-Y2 axis of FIG. 7A at the eighth-intermediate fabrication stage, according to an illustrative embodiment.

FIG. 5 illustrates semiconductor structure 100 at a fifth-intermediate fabrication stage. During this stage, the remaining masking layer 116 is removed along with hardmask layer 110 by, for example, an ash etching process. In illustrative embodiments, the etching material can be an oxygen ash or a nitrogen or hydrogen-based chemistry including, e.g., nitrogen gas or hydrogen gas, or a combination thereof. The ash etching process removes the remaining masking layer 116 with little or no gouging of the underlying components of the semiconductor structure 100.

Next, shallow trench isolation (STI) regions 118 can be formed on substrate 102. STI regions 118 comprises a dielectric material such as silicon oxide or silicon oxynitride, and is formed by methods known in the art. For example, in one illustrative embodiment, STI regions 118 are a shallow trench isolation oxide layer. Sidewall spacers 114 and STI regions 118 are recessed to be coplanar with the bottom surface of sacrificial layer 105.

FIGS. 6A-6E illustrate semiconductor structure 100 at a sixth-intermediate fabrication stage. During this stage, dummy gate 122 and hardmask layer 124 on the top most nanosheet channel layer 108-3. Suitable dummy gate material includes, for example, polycrystalline silicon, amorphous silicon or microcrystal silicon. Hardmask layer 124 can be composed of a flowable organic material such as, for example, a spin-on-carbon (SOC), Si$_3$N$_4$, SiBCN, SINC, SiN, SiCO, SiO$_2$, and SiNOC. The dummy gate can be formed by conventional lithographic and etching processes of hardmask layer 124.

Next, bottom dielectric isolation (BDI) layer 120 is formed by selectively removing sacrificial layer 105 without etching the sacrificial layers 106 and nanosheet channel layers 108 in the stack. That is, the sacrificial layer 105 can be etched/removed without removing the sacrificial layers 106 alternatingly formed with nanosheet channel layers 108. After removal of sacrificial layer 105, the cavity is replaced with a dielectric fill to form BDI layer 120. In one embodiment, the BDI layer 120 can be formed during deposition of sidewall spacers 126. In some other embodiments, the BDI layer 120 can be a different material than sidewall spacers 126. In one illustrative embodiment, the BDI layer 120 and sidewall spacers 126 can independently be a nitride or an oxynitride such as, for example, Si$_3$N$_4$, SiBCN, SiNC, SiN, SiCO, SiO$_2$ and SiNOC. In some exemplary embodiments, sidewall spacers 126 can include a material that is resistant to some etching processes such as, for example, HF chemical etching or chemical oxide removal etching. The BDI layer 120 and sidewall spacers 126 can be formed using conventional deposition techniques such as by physical vapor deposition (PVD), atomic layer deposition (ALD), chemical vapor deposition (CVD), etc.

FIGS. 7A-7E illustrate semiconductor structure 100 at a seventh-intermediate fabrication stage. During this stage, a masking layer 128 is deposited on semiconductor structure 100 and subjected to a trench or opening patterning procedure, e.g., conventional lithographic and etching processes utilizing, e.g., a RIE process (with, e.g., a halogen-based plasma chemistry) to remove at least a segment of masking layer 128, BDI layer 120 and a portion of substrate 102 thereby forming an opening 129 therein. Masking layer 128 can be formed in a similar manner and of a similar material as masking layer 116.

FIGS. 8A-8D illustrate semiconductor structure 100 at an eighth-intermediate fabrication stage. During this stage, sacrificial placeholder layer 130 is formed in opening 129 and is below the bottommost sacrificial layer 106-1 and coplanar with BDI layer 120. The sacrificial placeholder layer 130 is comprised of a sacrificial material or materials, such as SiGe, titanium oxide (TiO$_x$), aluminum oxide (AlO$_x$), silicon carbide (SiC), etc. The sacrificial material or materials can be deposited by convention techniques such as ALD, PVD, CVD, etc. when forming sacrificial placeholder layer 130.

FIGS. 9A-9D illustrate semiconductor structure 100 at a ninth-intermediate fabrication stage. During this stage, dummy gate 122 and sacrificial layers 106-1, 106-2 and 106-3 are removed, followed by formation of source/drain regions 132A and 132B and inner spacers 134. Dummy gate 122 and sacrificial layers 106-1, 106-2 and 106-3 are selectively removed using a suitable etching process such as, for example, RIE.

The source/drain regions 132A and 132B may be formed on BDI layer 120 using epitaxial growth processes. The source/drain regions 132A and 132B may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (TI). In some embodiments, the epitaxy process comprises in-situ doping (dopants are incorporated in epitaxy material during epitaxy). In illustrative embodiments, source/drain regions 132A are doped with a P-type dopant to form a P-type source/drain region and source/drain regions 132B are doped with an N-type dopant to form an N-type source/drain region.

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

The inner spacers 134 may be formed by filling indent spaces resulting from selective indent etches of the sacrificial layers 106. The inner spacers 134 may be formed of silicon nitride (SiN) or another suitable material such as SiBCN, silicon carbide oxide (SiCO), SiOCN, etc. The inner spacers 134 can be formed using conventional deposition techniques such as by PVD, ALD, CVD, etc.

An interlayer dielectric layer (ILD) layer 136 is formed on source/drain regions 132A and 132B and STI regions 118 by convention techniques such as ALD, PVD, CVD, etc. The ILD layer 136 may be formed of any suitable isolating material, such as $SiO_2$, SiOC, SiON, etc.

Figures 9A, 9B:
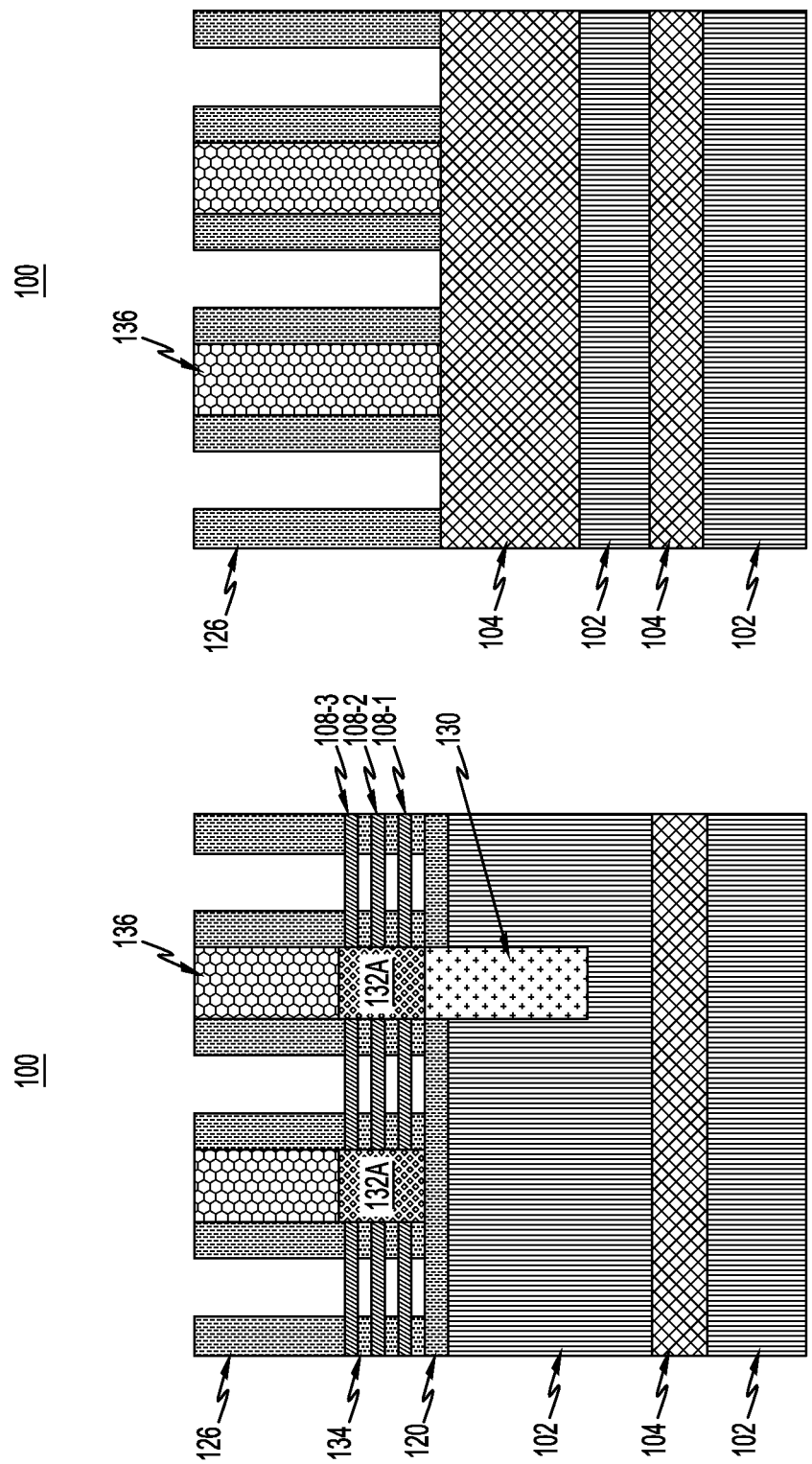
FIG. 9A is a cross-sectional view illustrating the semiconductor structure taken along the X1-X1 axis of FIG. 7A at a ninth-intermediate fabrication stage, according to an illustrative embodiment.
FIG. 9B is a cross-sectional view illustrating the semiconductor structure taken along the X2-X2 axis of FIG. 7A at the ninth-intermediate fabrication stage, according to an illustrative embodiment.
Figure 9D:
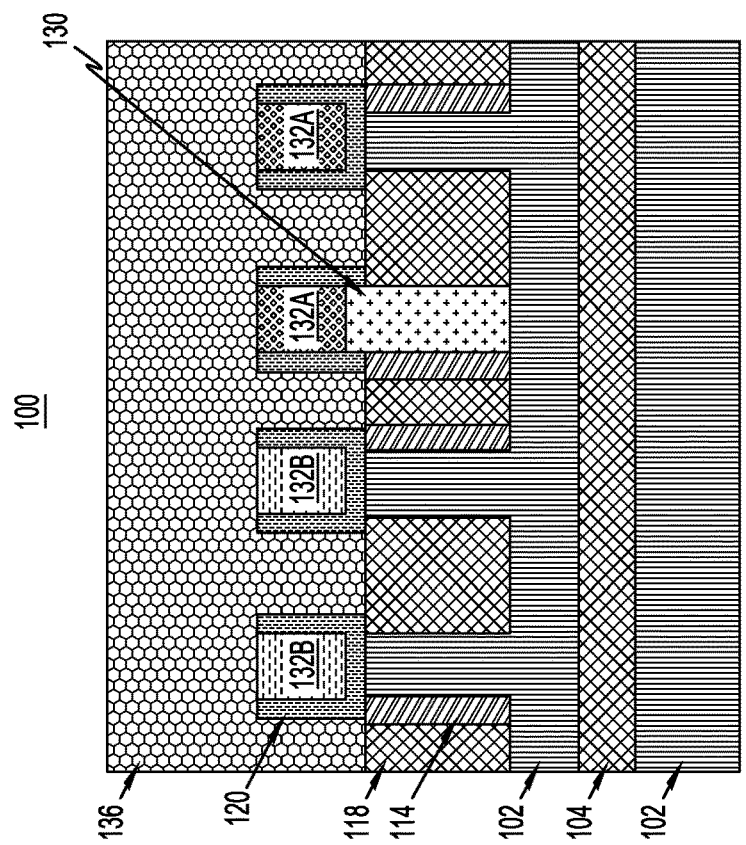
FIG. 9D is a cross-sectional view illustrating the semiconductor structure taken along the Y2-Y2 axis of FIG. 7A at the ninth-intermediate fabrication stage, according to an illustrative embodiment.
Figure 9C:
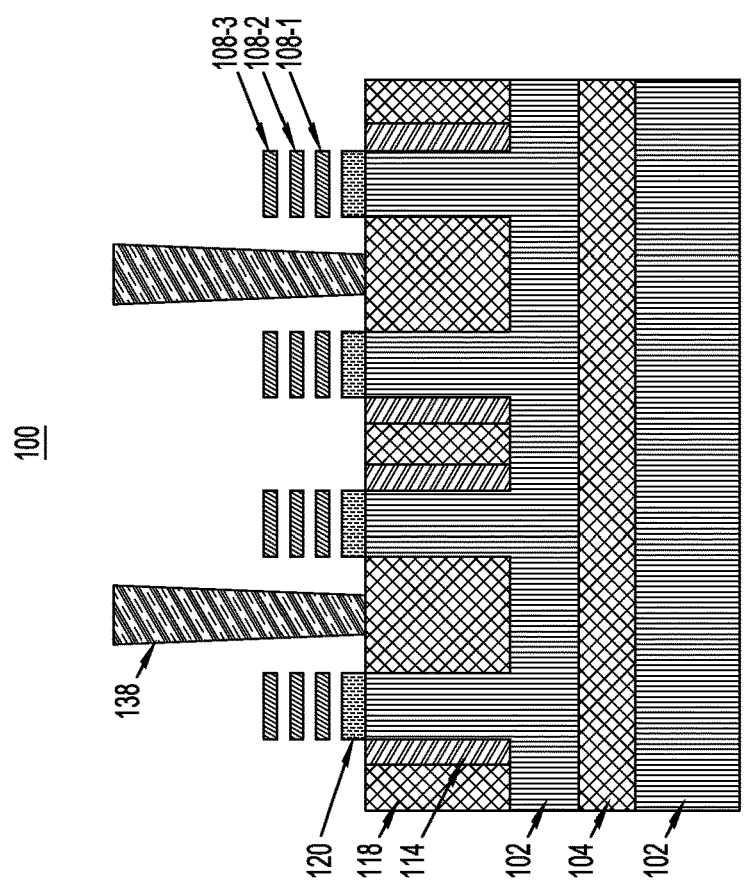
FIG. 9C is a cross-sectional view illustrating the semiconductor structure taken along the Y1-Y1 axis of FIG. 7A at the ninth-intermediate fabrication stage, according to an illustrative embodiment.
Figure 10D:
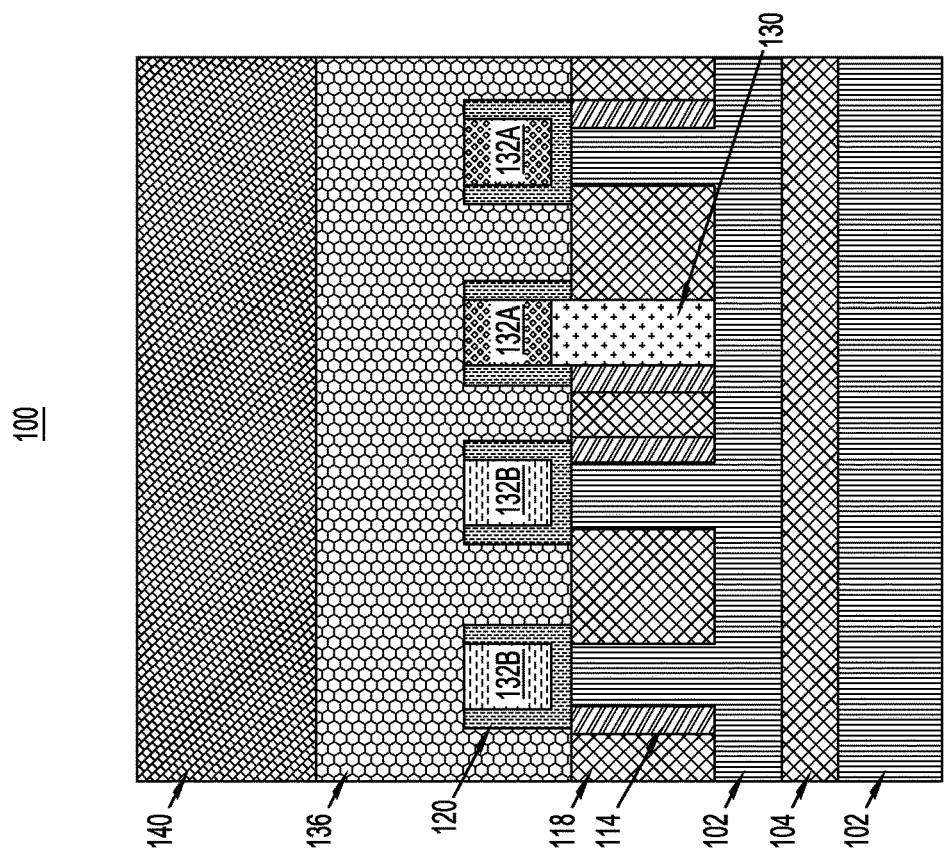
FIG. 10D is a cross-sectional view illustrating the semiconductor structure taken along the Y2-Y2 axis of FIG. 7A at the tenth-intermediate fabrication stage, according to an illustrative embodiment.
Figure 10C:
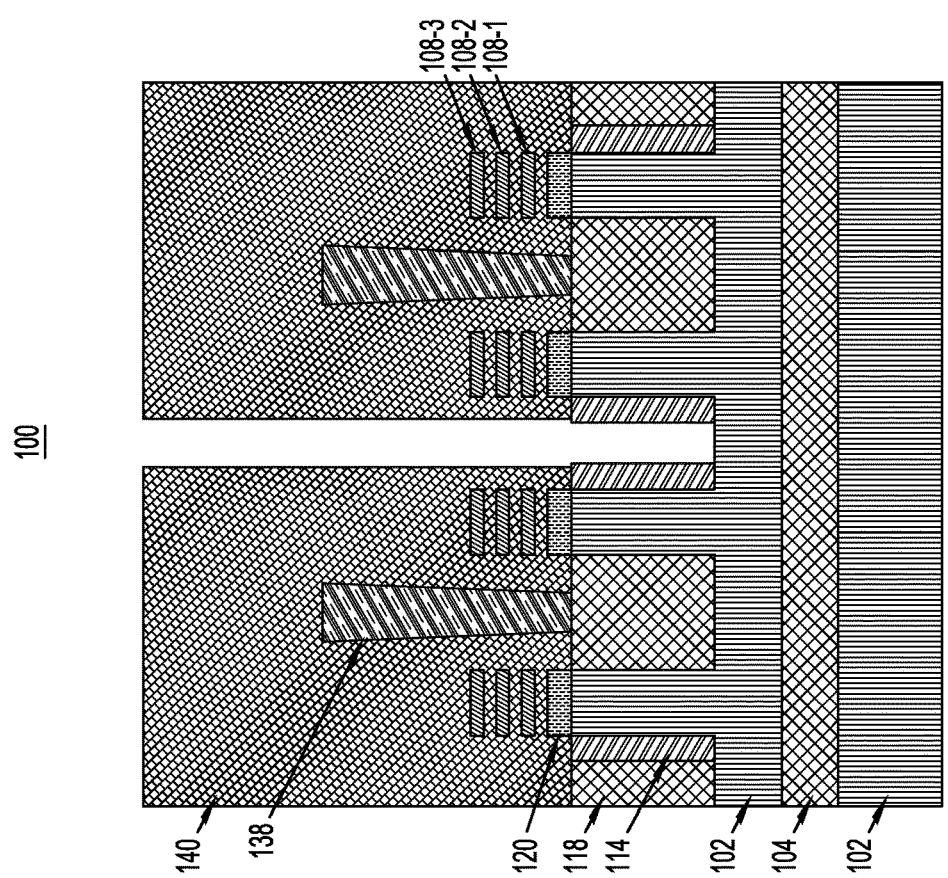
FIG. 10C is a cross-sectional view illustrating the semiconductor structure taken along the Y1-Y1 axis of FIG. 7A at the tenth-intermediate fabrication stage, according to an illustrative embodiment.
Figures 11A, 11B:
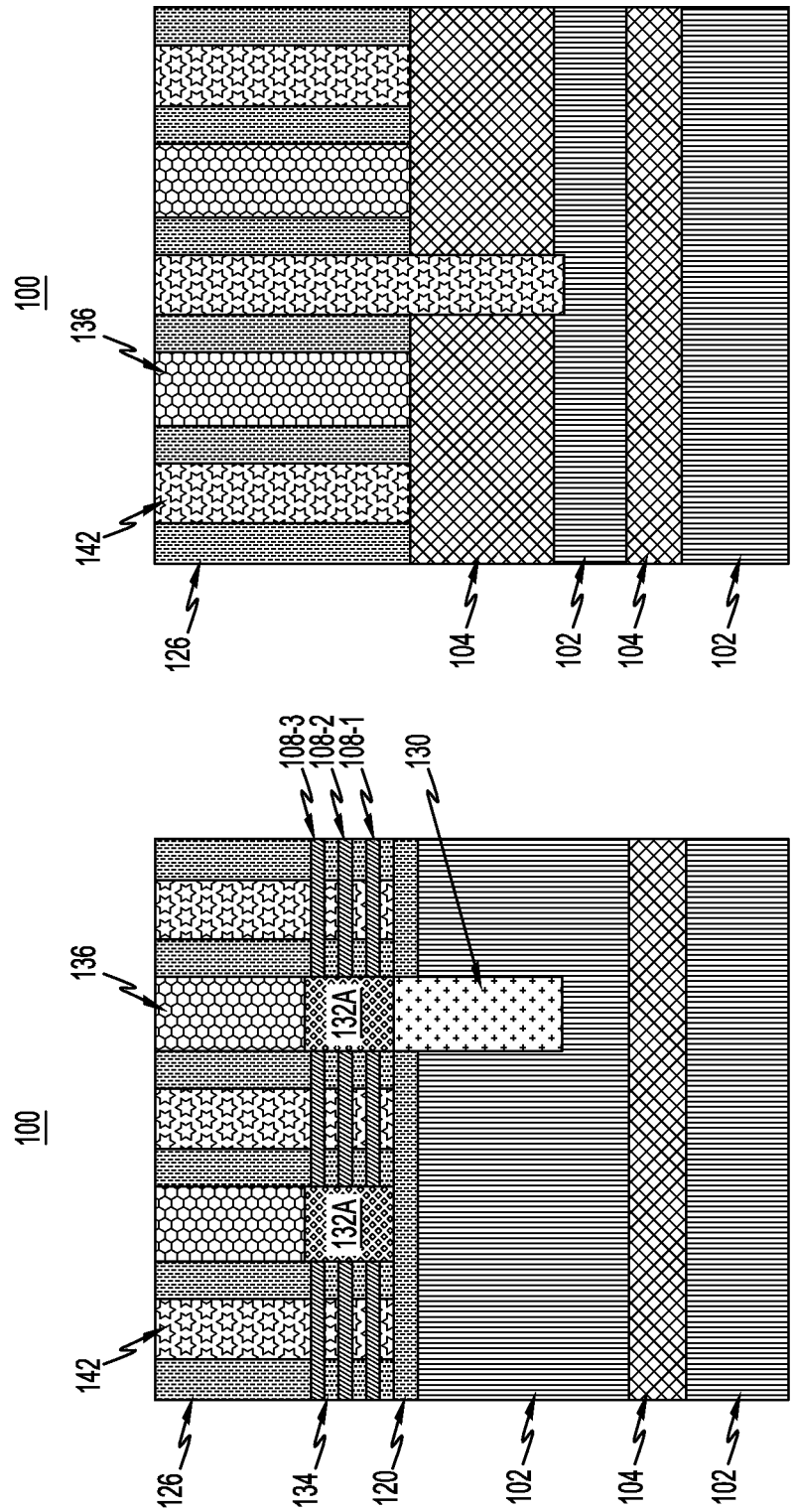
FIG. 11A is a cross-sectional view illustrating the semiconductor structure taken along the X1-X1 axis of FIG. 7A at an eleventh-intermediate fabrication stage, according to an illustrative embodiment.
FIG. 11B is a cross-sectional view illustrating the semiconductor structure taken along the X2-X2 axis of FIG. 7A at the eleventh-intermediate fabrication stage, according to an illustrative embodiment.
Figure 11D:
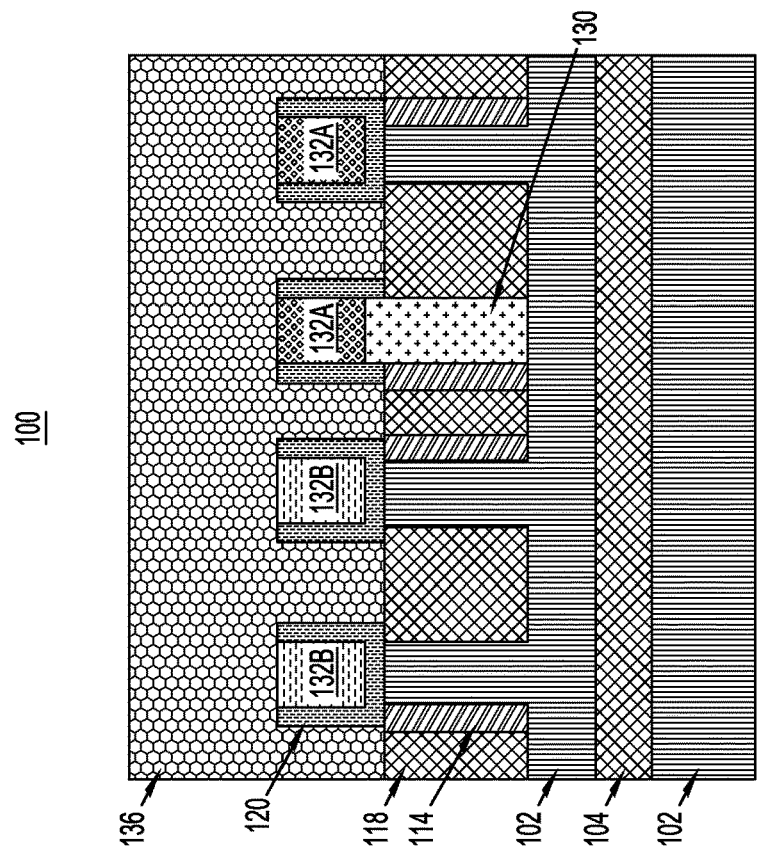
FIG. 11D is a cross-sectional view illustrating the semiconductor structure taken along the Y2-Y2 axis of FIG. 7A at the eleventh-intermediate fabrication stage, according to an illustrative embodiment.
Figure 11C:
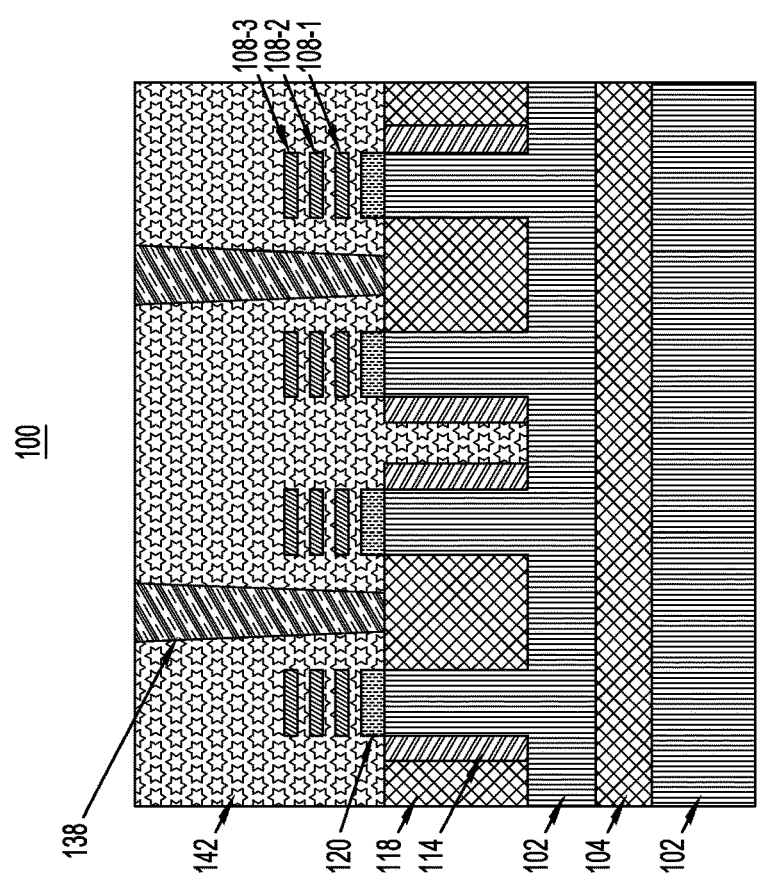
FIG. 11C is a cross-sectional view illustrating the semiconductor structure taken along the Y1-Y1 axis of FIG. 7A at the eleventh-fabrication stage, according to an illustrative embodiment.
Figures 13A, 13B:
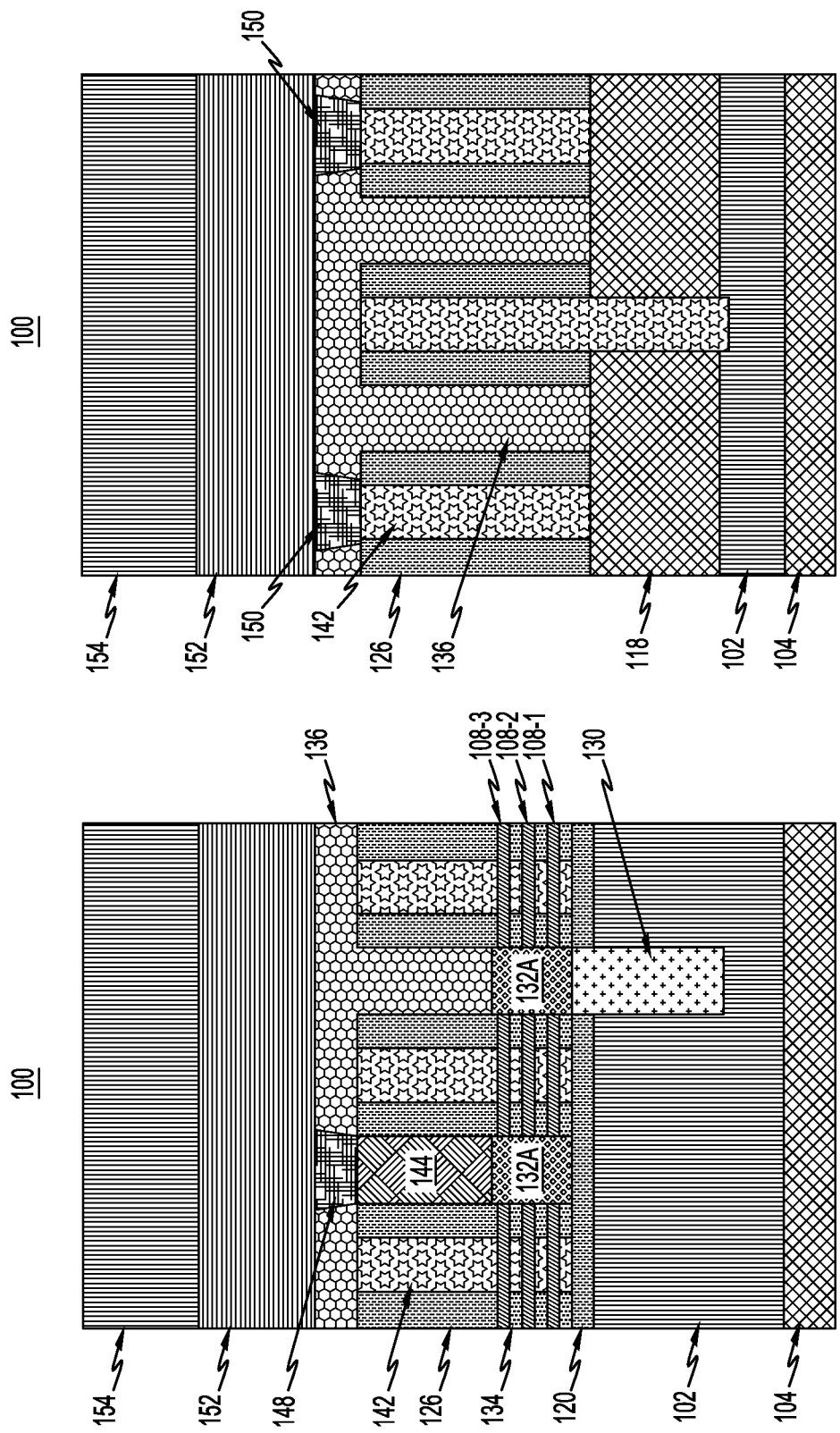
FIG. 13A is a cross-sectional view illustrating the semiconductor structure taken along the X1-X1 axis of FIG. 7A at a thirteenth-intermediate fabrication stage, according to an illustrative embodiment.
FIG. 13B is a cross-sectional view illustrating the semiconductor structure taken along the X2-X2 axis of FIG. 7A at the thirteenth-intermediate fabrication stage, according to an illustrative embodiment.
Figure 13D:
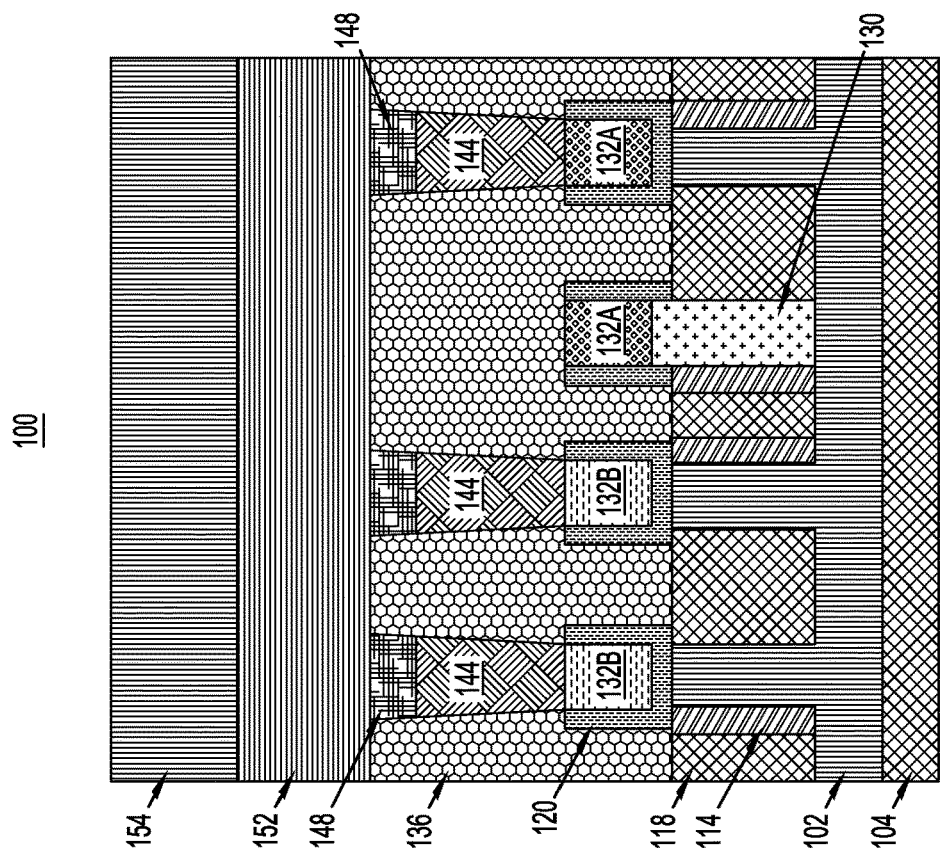
FIG. 13D is a cross-sectional view illustrating the semiconductor structure taken along the Y2-Y2 axis of FIG. 7A at the thirteenth-intermediate fabrication stage, according to an illustrative embodiment.
Figure 13C:
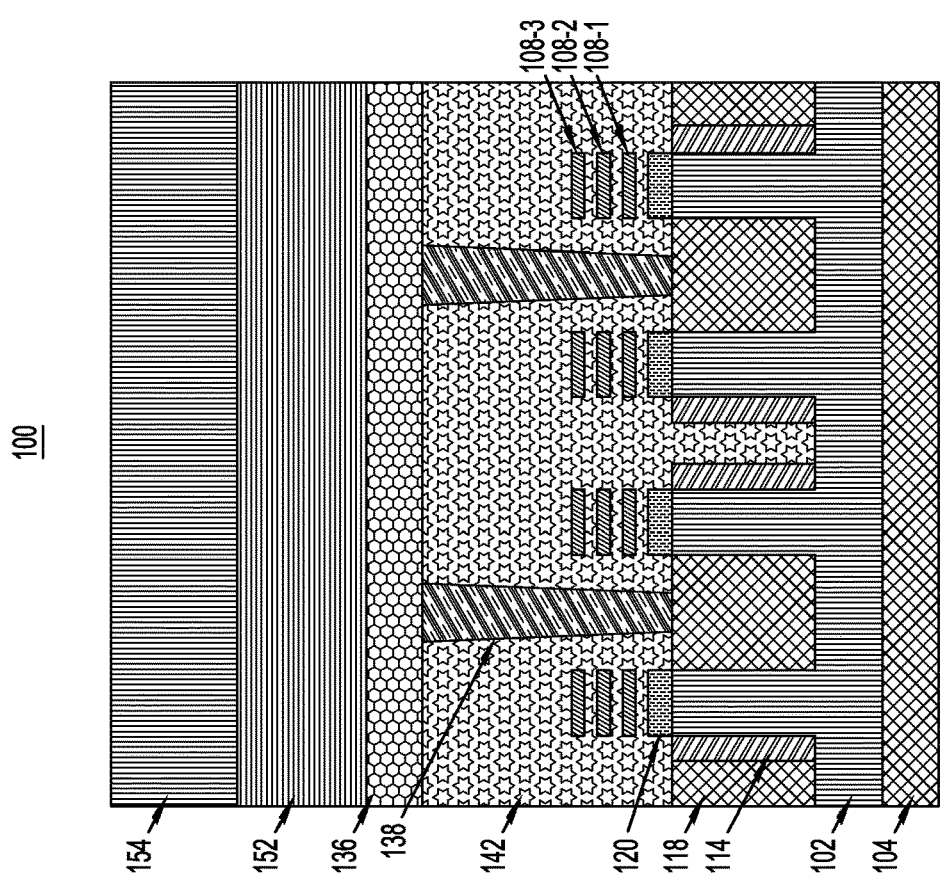
FIG. 13C is a cross-sectional view illustrating the semiconductor structure taken along the Y1-Y1 axis of FIG. 7A at the thirteenth-fabrication stage, according to an illustrative embodiment.
Figures 14A, 14B:
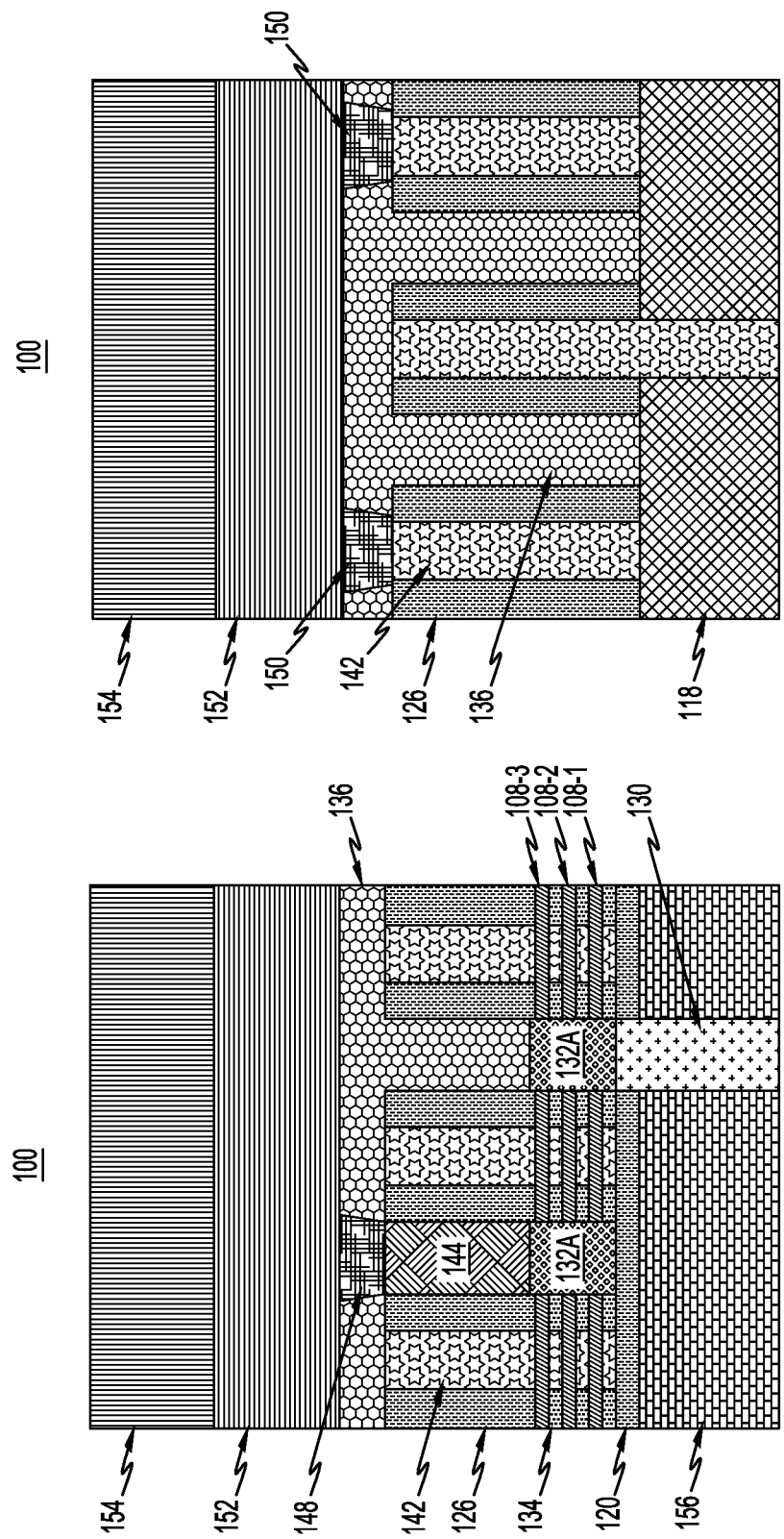
FIG. 14A is a cross-sectional view illustrating the semiconductor structure taken along the X1-X1 axis of FIG. 7A at a fourteenth-intermediate fabrication stage, according to an illustrative embodiment.
FIG. 14B is a cross-sectional view illustrating the semiconductor structure taken along the X2-X2 axis of FIG. 7A at the fourteenth-intermediate fabrication stage, according to an illustrative embodiment.
Figure 14D:
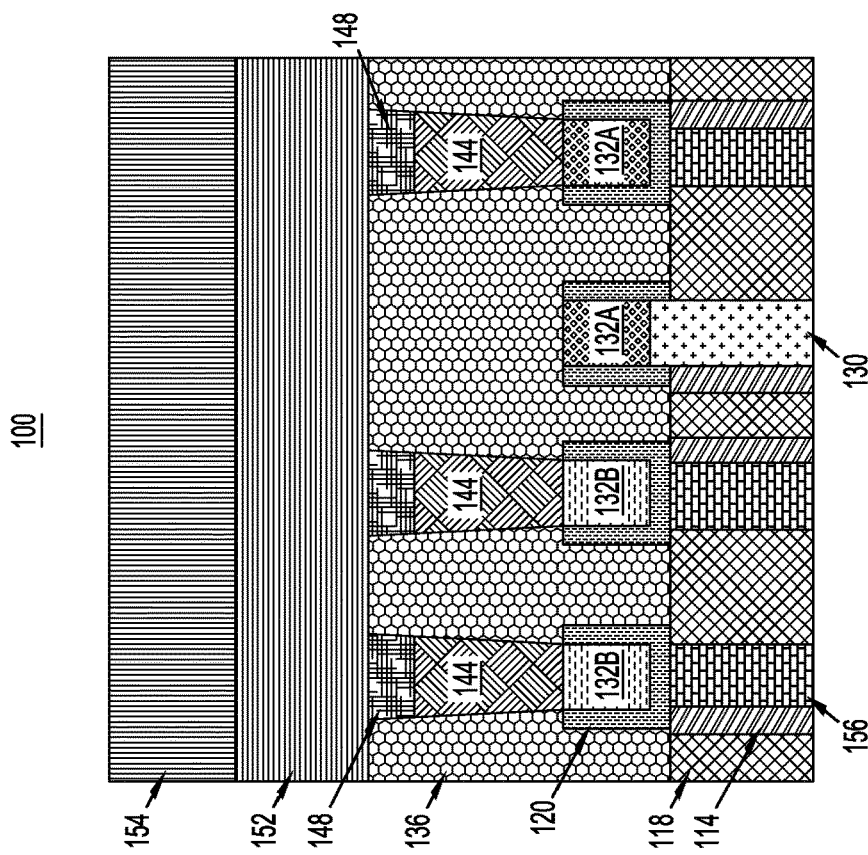
FIG. 14D is a cross-sectional view illustrating the semiconductor structure taken along the Y2-Y2 axis of FIG. 7A at the fourteenth-intermediate fabrication stage, according to an illustrative embodiment.
Figure 14C:
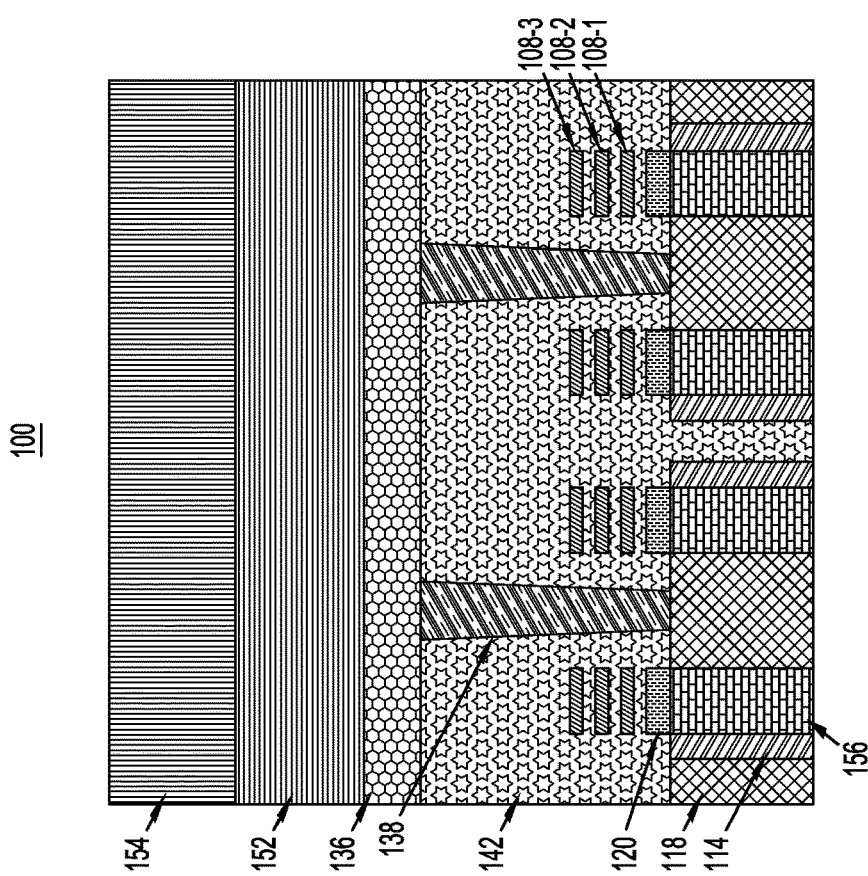
FIG. 14C is a cross-sectional view illustrating the semiconductor structure taken along the Y1-Y1 axis of FIG. 7A at the fourteenth-fabrication stage, according to an illustrative embodiment.
Figure 15D:
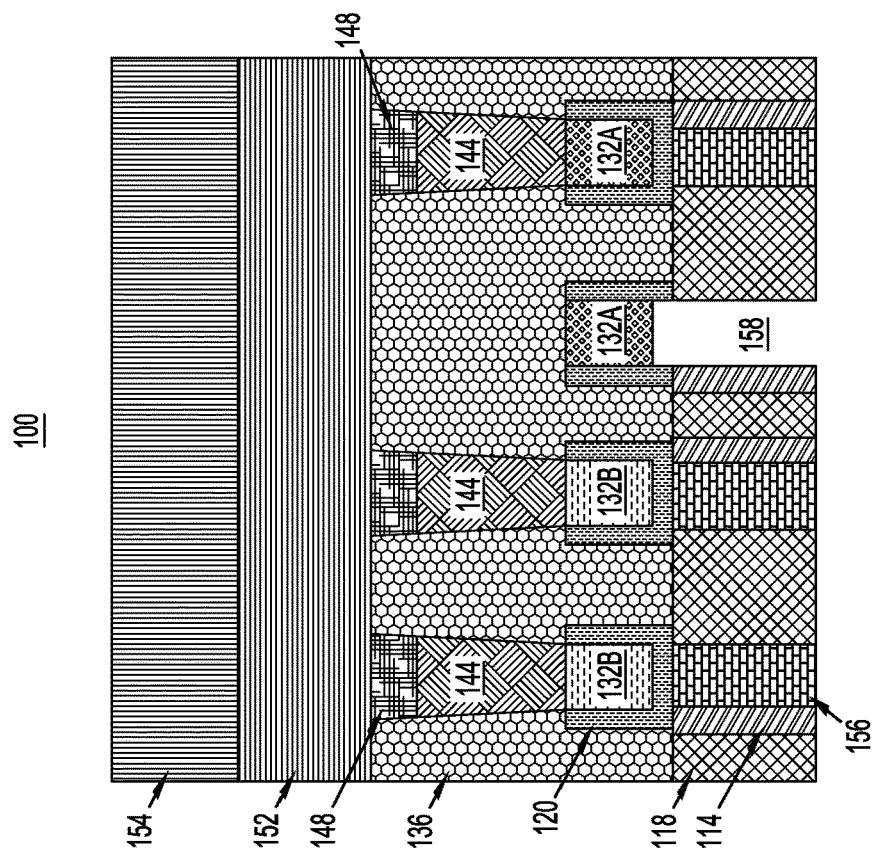
FIG. 15D is a cross-sectional view illustrating the semiconductor structure taken along the Y2-Y2 axis of FIG. 7A at the fifteenth-intermediate fabrication stage, according to an illustrative embodiment.
Figure 15C:
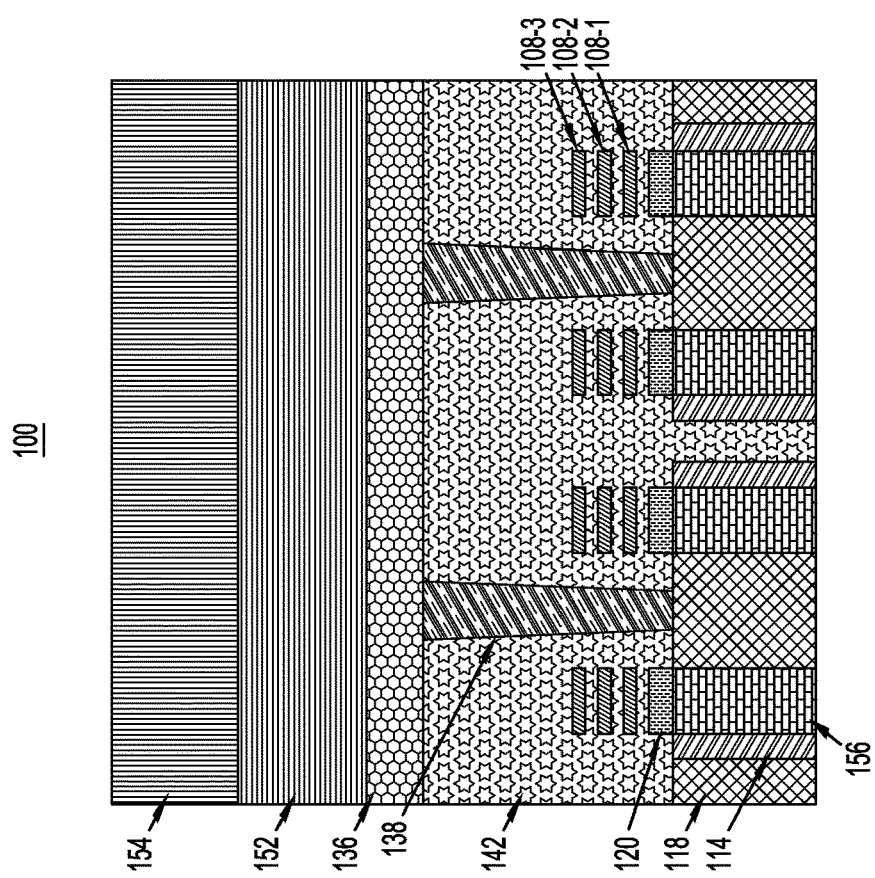
FIG. 15C is a cross-sectional view illustrating the semiconductor structure taken along the Y1-Y1 axis of FIG. 7A at the fifteenth-fabrication stage, according to an illustrative embodiment.
Figures 16A, 16B:
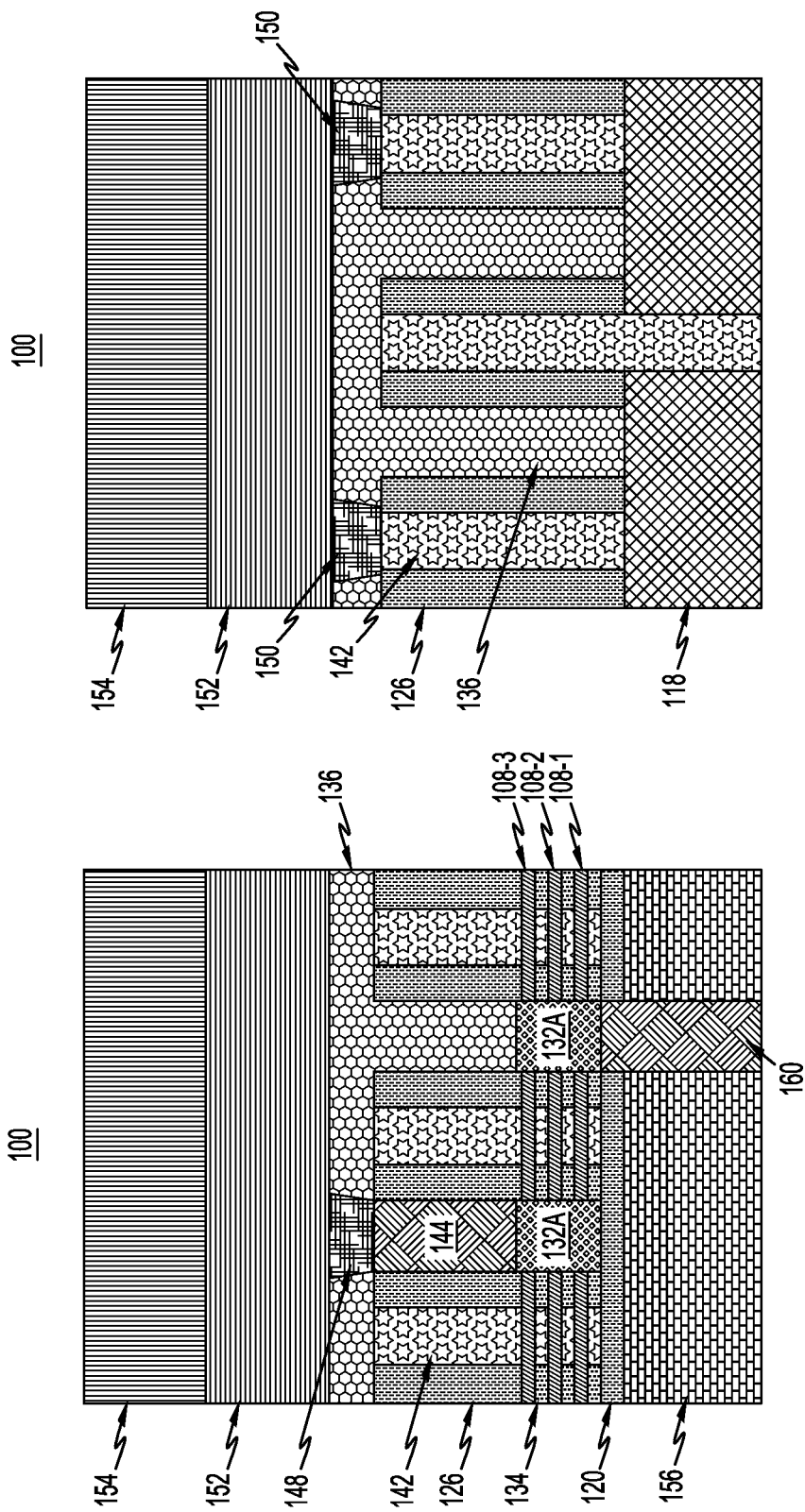
FIG. 16A is a cross-sectional view illustrating the semiconductor structure taken along the X1-X1 axis of FIG. 7A at a sixteenth-intermediate fabrication stage, according to an illustrative embodiment.
FIG. 16B is a cross-sectional view illustrating the semiconductor structure taken along the X2-X2 axis of FIG. 7A at the sixteenth-intermediate fabrication stage, according to an illustrative embodiment.
Figure 16D:
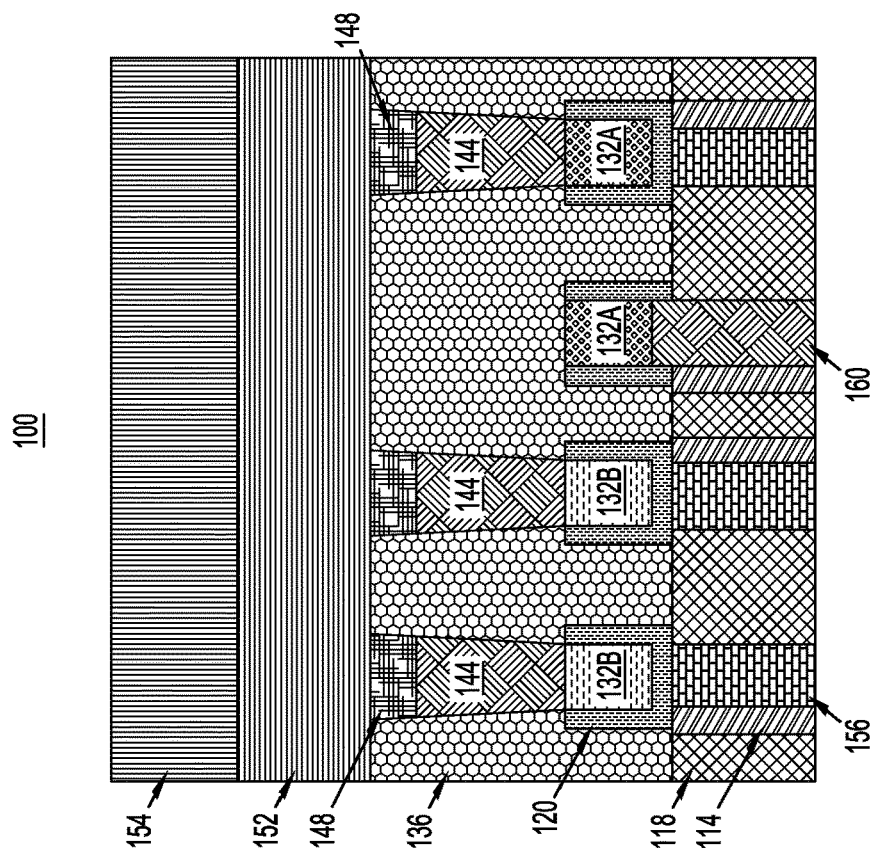
FIG. 16D is a cross-sectional view illustrating the semiconductor structure taken along the Y2-Y2 axis of FIG. 7A at the sixteenth-intermediate fabrication stage, according to an illustrative embodiment.
Figure 16C:
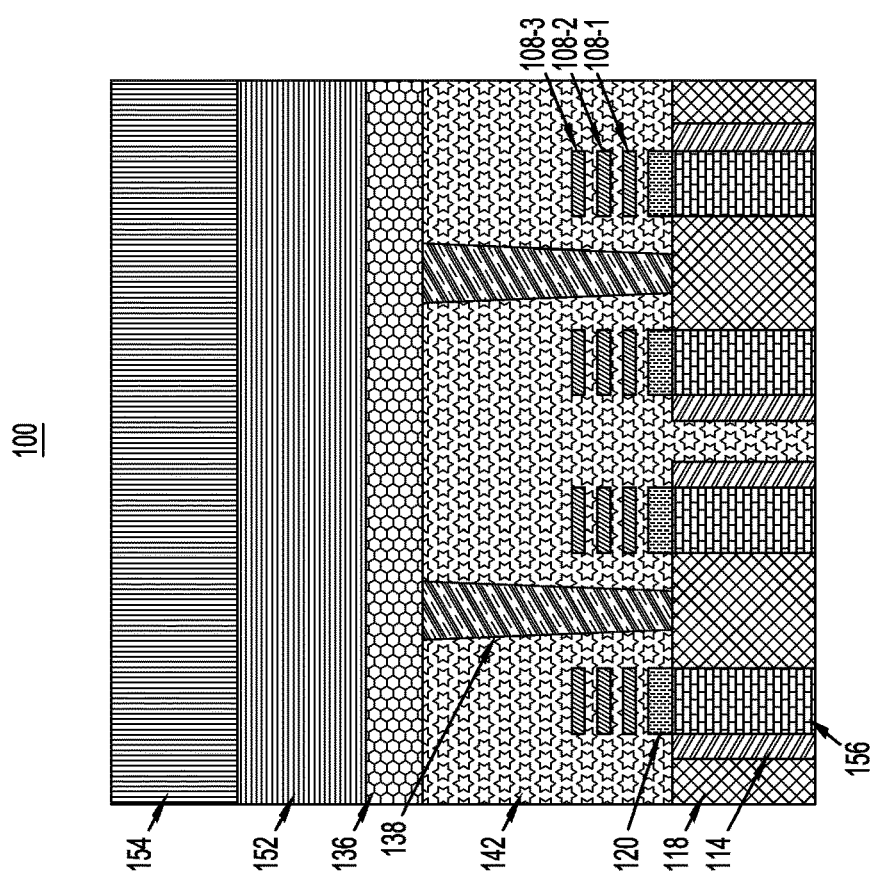
FIG. 16C is a cross-sectional view illustrating the semiconductor structure taken along the Y1-Y1 axis of FIG. 7A at the sixteenth-fabrication stage, according to an illustrative embodiment.
Figure 17D:
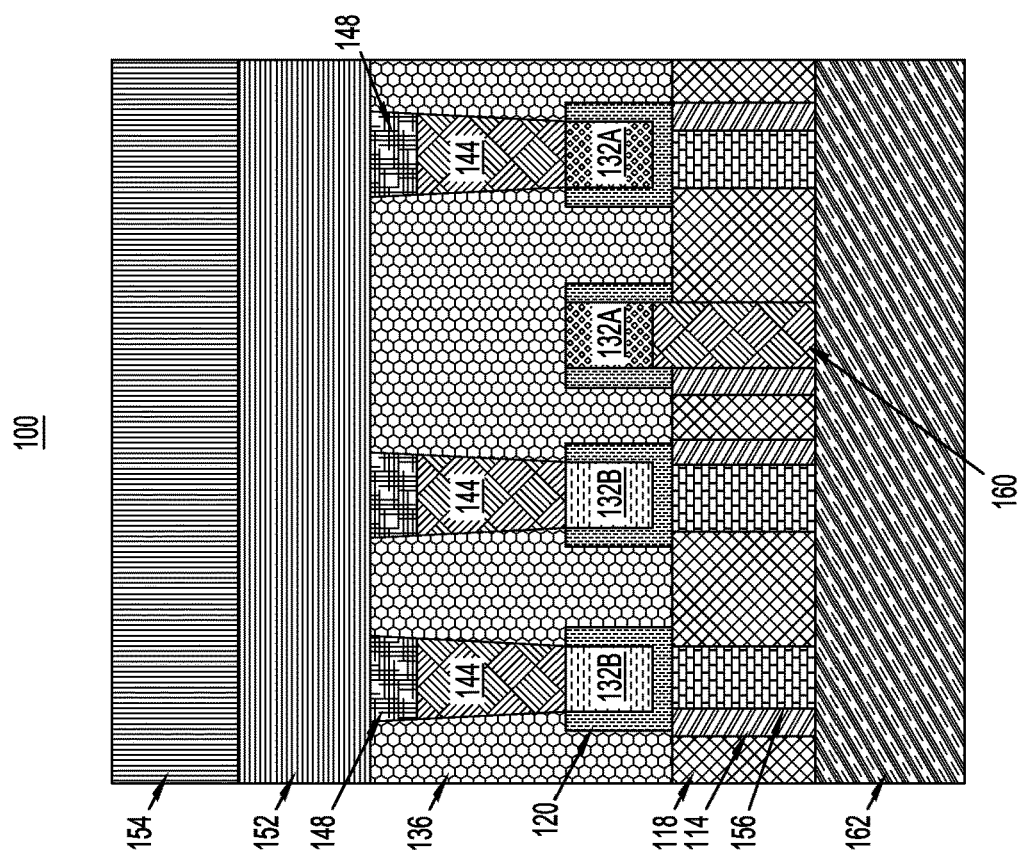
FIG. 17D is a cross-sectional view illustrating the semiconductor structure taken along the Y2-Y2 axis of FIG. 7A at the seventeenth-intermediate fabrication stage, according to an illustrative embodiment.
Figure 17C:
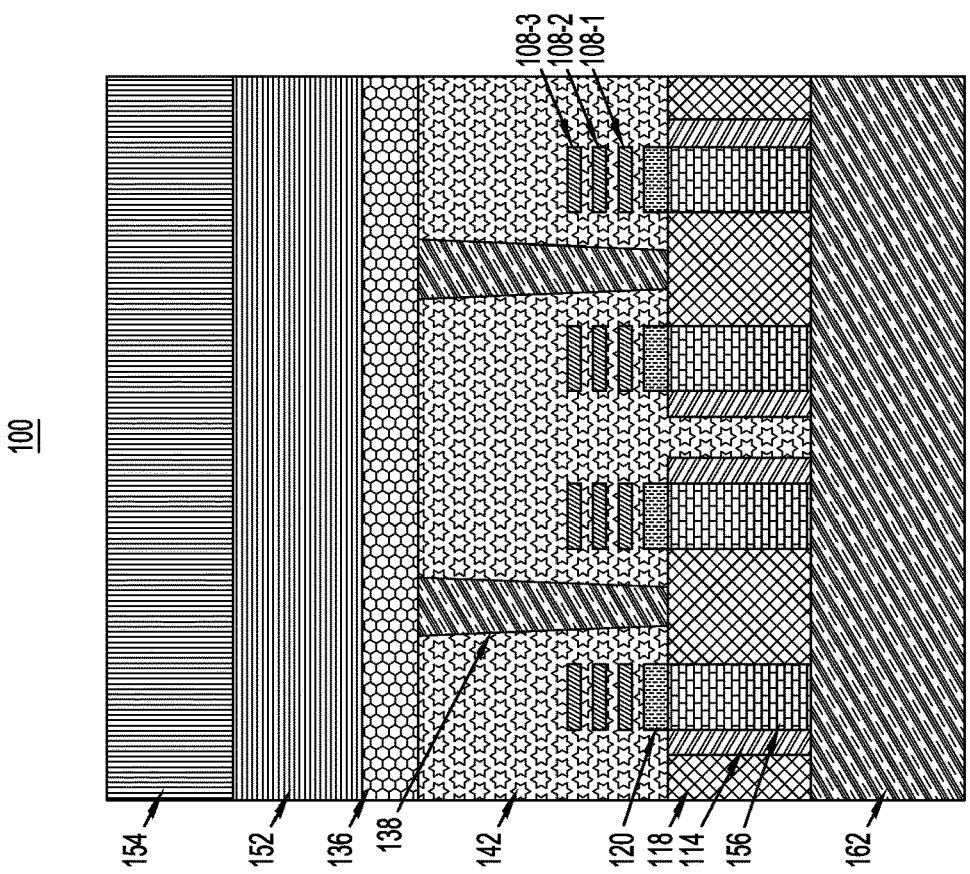
FIG. 17C is a cross-sectional view illustrating the semiconductor structure taken along the Y1-Y1 axis of FIG. 7A at the seventeenth-fabrication stage, according to an illustrative embodiment.
Figure 18D:
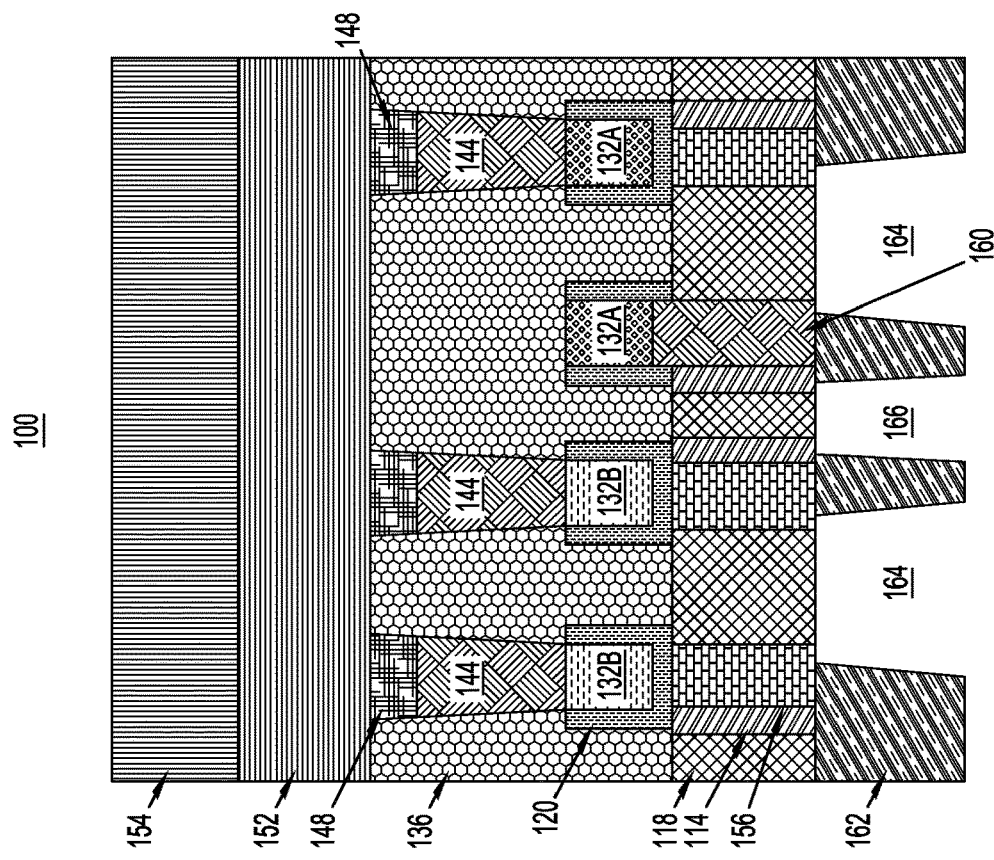
FIG. 18D is a cross-sectional view illustrating the semiconductor structure taken along the Y2-Y2 axis of FIG. 7A at the eighteenth-intermediate fabrication stage, according to an illustrative embodiment.
Figure 18C:
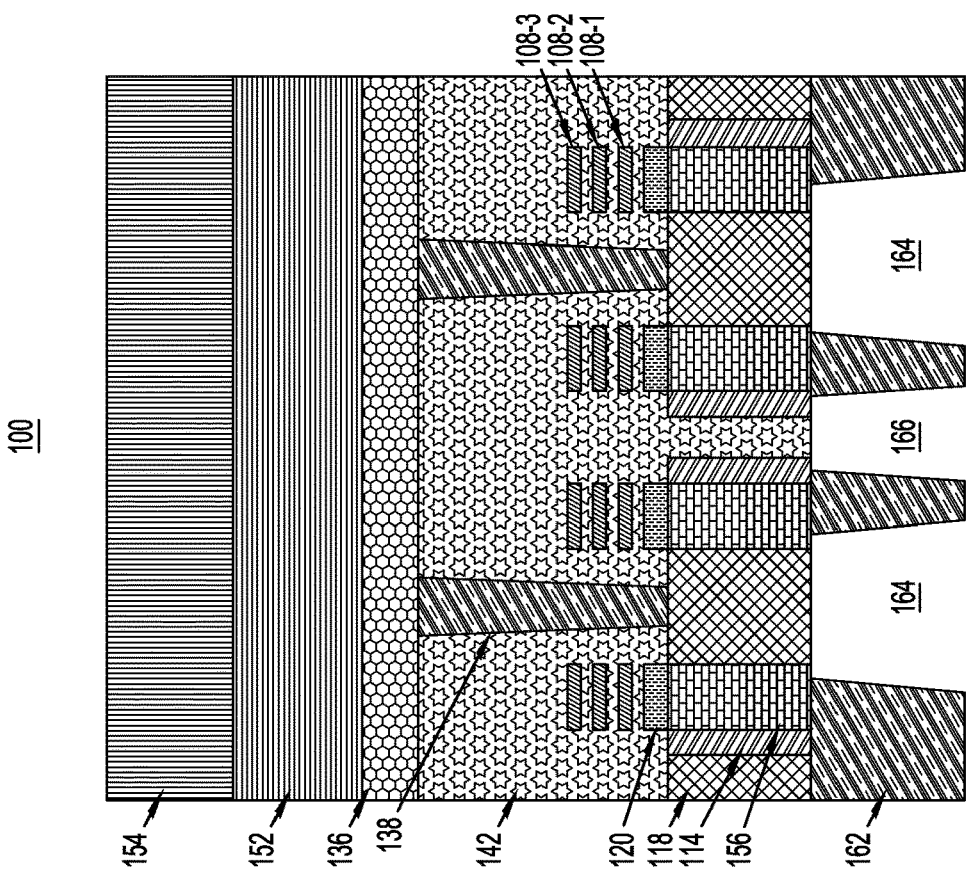
FIG. 18C is a cross-sectional view illustrating the semiconductor structure taken along the Y1-Y1 axis of FIG. 7A at the eighteenth-fabrication stage, according to an illustrative embodiment.
Figure 19D:
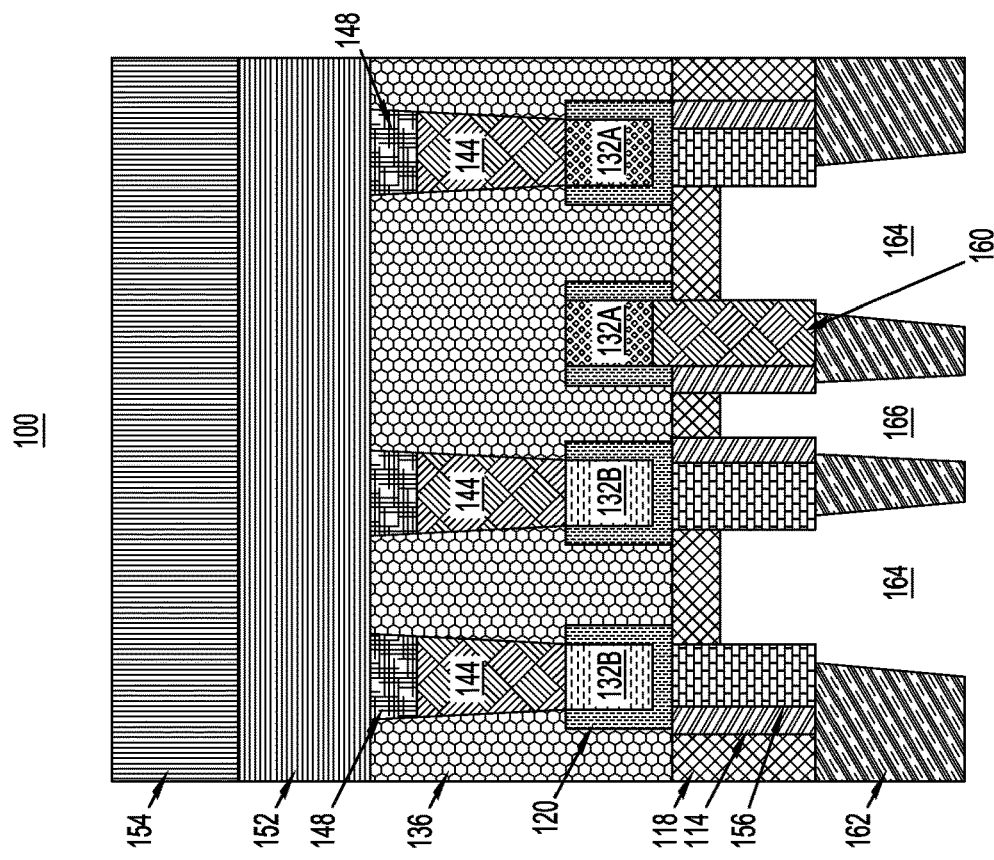
FIG. 19D is a cross-sectional view illustrating the semiconductor structure taken along the Y2-Y2 axis of FIG. 7A at the nineteenth-intermediate fabrication stage, according to an illustrative embodiment.
Figure 19C:
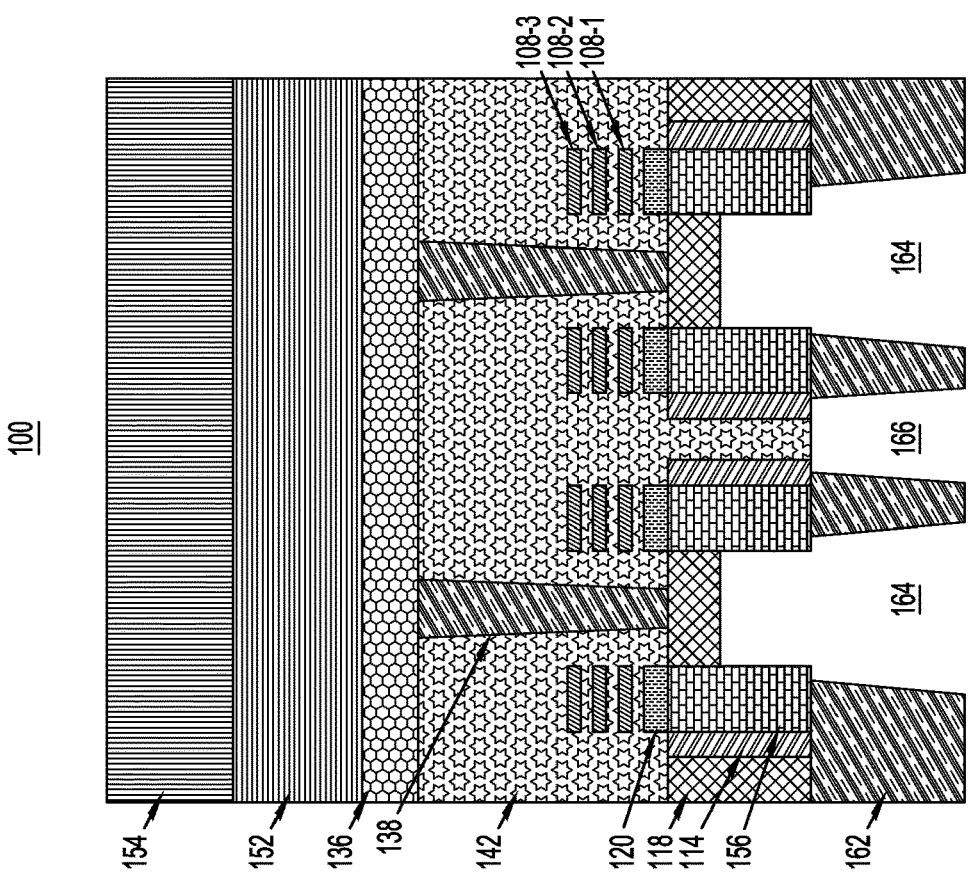
FIG. 19C is a cross-sectional view illustrating the semiconductor structure taken along the Y1-Y1 axis of FIG. 7A at the nineteenth-fabrication stage, according to an illustrative embodiment.

FIG. 9C shows isolation dielectric pillars 138 formed on STI regions 118. Isolation dielectric pillars 138 are formed by patterning hardmask layer 124 over the dummy gate 122 (not shown), followed by lithographic processing to result in a patterned hardmask layer. A cut is performed in the dummy gate 122 between the FET structures and exposing the top surface of STI regions 118 to form an opening (not shown). Next, the isolation dielectric pillars 138 can be obtained by filling a dielectric material such as SiN, $SiO_2$, SiOC, SiOCN, SiBCN, SiC, etc. in the openings, followed by planarization such as CMP or other suitable planarization processes. The hardmask layer 124 and dummy gate 122 can then be removed as discussed above.

FIGS. 10A-10D illustrate semiconductor structure 100 at a tenth-intermediate fabrication stage. During this stage, masking layer 140 is deposited over semiconductor structure 100 and subjected to a trench or opening patterning procedure, e.g., conventional lithographic and etching processes utilizing, e.g., a RIE process (with, e.g., a halogen-based plasma chemistry) to remove at least a segment of masking layer 140 and the STI region of STI regions 118 within sidewall spacers 114 between the first set of FET stacks and the second set of FET stacks thereby forming an opening therein. Masking layer 140 can be formed in a similar manner and of a similar material as masking layer 116.

FIGS. 11A-11D illustrate semiconductor structure 100 at an eleventh-intermediate fabrication stage. During this stage, the remaining masking layer 140 is removed in a similar manner as masking layer 116, for example, an ash etching process, followed by formation of a gate stack layer 142 using, for example, replacement high-k metal gate (HKMG) processing. The gate stack layer 142 may comprise a gate dielectric layer and a gate conductor layer. The gate dielectric layer may be formed of a high-k dielectric material. Examples of high-k dielectric materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

FIGS. 12A-12D illustrate semiconductor structure 100 at a twelfth-intermediate fabrication stage. During this stage, middle-of-the-line contacts 144 are first formed by any conventional technique. For example, middle-of-the-line contacts 144 can be formed by depositing an additional amount of ILD layer 136 and utilizing conventional lithographic and selective etch processes such as a wet or dry etch etching process in ILD layer 136 to form a via. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants.

Next, a high conductance metal is deposited in the vias to form middle-of-the-line contacts 144. Suitable high conductance metals include, for example, conductive material such as, for example, tungsten (W), aluminum (Al), copper (Cu), cobalt (Co), ruthenium (Ru), molybdenum (Mo), or any other suitable conductive material. In various embodiments, the high conductance metal can be deposited by ALD, CVD, PVD, and/or plating. The high conductance metal can be planarized using, for example, a planarizing process such as CMP. Other planarization processes can include grinding and polishing.

Metal vias 148 and 150 can also be formed in ILD layer 136 when forming middle-of-the-line contacts 144. Next, a suitable conductive metal is deposited into the via hole in ILD layer 136. Another suitable conductive metal is deposited into the via hole and on middle-of-the-line contacts 144 to form metal vias 148 as depicted in FIGS. 12A and 12D. In addition, another suitable conductive metal is deposited into the via hole and on gate stack layer 142 to form metal vias 150 as depicted in FIG. 12C. A suitable metal for metal vias 148 and 150 can independently be any of the metals discussed above for middle-of-the-line contacts 144.

Frontside back-end-of-line (BEOL) interconnect 152 is then formed followed by bonding of the structure (e.g., the frontside BEOL interconnect 152) to a carrier wafer 154.

The frontside BEOL interconnect 152 includes various BEOL interconnect structures. For example, frontside BEOL interconnect 152 is a metallization structure that includes one or more metal layers disposed on a side of semiconductor structure 100 opposite of the side on which the backside BEOL metallization structure is disposed. The metal layers of the frontside BEOL interconnect 152 each have metal lines for making interconnections to the semiconductor device.

The carrier wafer 154 may be formed of materials similar to that of the substrate 102, and may be formed over the frontside BEOL interconnect 152 using a wafer bonding process, such as dielectric-to-dielectric bonding.

FIGS. 13A-13D illustrate semiconductor structure 100 at a thirteenth-intermediate fabrication stage. During this stage, backside processing of the substrate 102 is carried out. This can be accomplished, for example, by flipping the structure over so that the backside of the substrate 102 (i.e., the back surface) is facing up. First, portions of the substrate 102 may be removed from the backside using, for example, a combination of wafer grinding, CMP, dry etch and/or wet etch to selectively remove substrate 102 until the etch stop layer 104 is reached.

FIGS. 14A-14D show semiconductor structure 100 at a fourteenth-intermediate fabrication stage. During this stage, the etch stop layer 104 is selectively removed using, for example, a wet etch to selectively remove etch stop layer 104 until substrate 102 is reached. The remaining portions of the substrate 102 are then removed utilizing a selective etch process such as a wet etch to expose the BDI layer 120. A first backside ILD layer 156 is then deposited in removed portions of substrate 102 utilizing conventional deposition techniques such as ALD, PVD, CVD, etc. First backside ILD layer 156 can be formed of a dielectric material that is different than the material for STI regions 118. In an illustrative embodiment, first backside ILD layer 156 is formed from SiC. Following formation of first backside ILD layer 156, any overfill can be removed by a planarization process such as CMP so that first backside ILD layer 156 is coplanar with sacrificial placeholder layer 130, STI regions 118 and sidewall spacers 114.

FIGS. 15A-15D illustrate semiconductor structure 100 at a fifteenth-intermediate fabrication stage. During this stage, sacrificial placeholder layer 130 is selectively removed to form an opening 158 using any suitable etch processing that removes the material of the sacrificial placeholder layer 130 selective to that of the rest of the structure. A suitable etching process includes, for example, wet etch.

FIGS. 16A-16D illustrate semiconductor structure 100 at a sixteenth-intermediate fabrication stage. During this stage, backside source/drain contacts 160 are formed by depositing a suitable contact metal in the openings 158. A suitable contact metal can be any of the contact metals discussed above for middle-of-the-line contacts 144.

FIGS. 17A-17D illustrate semiconductor structure 100 at a seventeenth-intermediate fabrication stage. During this stage, a second backside ILD layer 162 is then deposited on semiconductor structure 100 utilizing conventional deposition techniques such as ALD, PVD, CVD, etc. Second backside ILD layer 162 can be formed of a dielectric material that is different than the material for first backside ILD layer 156. In an illustrative embodiment, second backside ILD layer 162 is formed from SiN. Following formation of second backside ILD layer 162, a planarization process such as CMP can be carried out.

FIGS. 18A-18D illustrate semiconductor structure 100 at an eighteenth-intermediate fabrication stage. During this stage, backside metallization layer patterning of second backside ILD layer 162 is carried out to form openings 164 and 166. Openings 164 and 166 can be formed using a selective etching process such as RIE.

FIGS. 19A-19D illustrate semiconductor structure 100 at an nineteenth-intermediate fabrication stage. During this stage, STI regions 118 are recessed to extend openings 164 and 166 using a selective etching process that is selective to STI relative to first backside ILD layer 156 and second backside ILD layer 162. Openings 164 and 166 can be formed using a selective etching process such as RIE.

FIGS. 20A-20E illustrate semiconductor structure 100 at a twentieth-intermediate fabrication stage. During this stage, ground (GND or Vss) rails 168 to provide a series of power supplies, power (Vdd) rails 170 to provide supply voltage to the structure and signal rails 172 are formed by depositing a suitable conductive metal in openings 164 and 166. The conductive metal may include, but is not limited to, tungsten, copper, aluminum, silver, gold and alloys thereof.

Figure 20A:
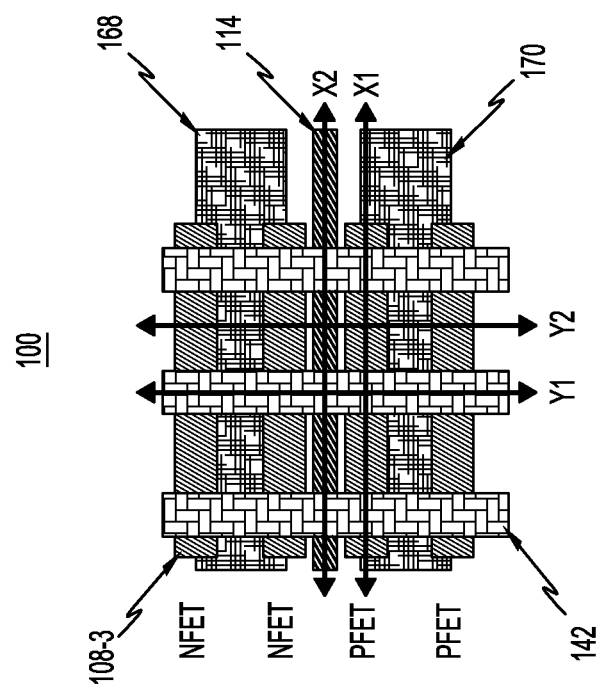
FIG. 20A is a top view illustrating the semiconductor structure at a twentieth-intermediate fabrication stage, according to an illustrative embodiment.
Figure 20E:
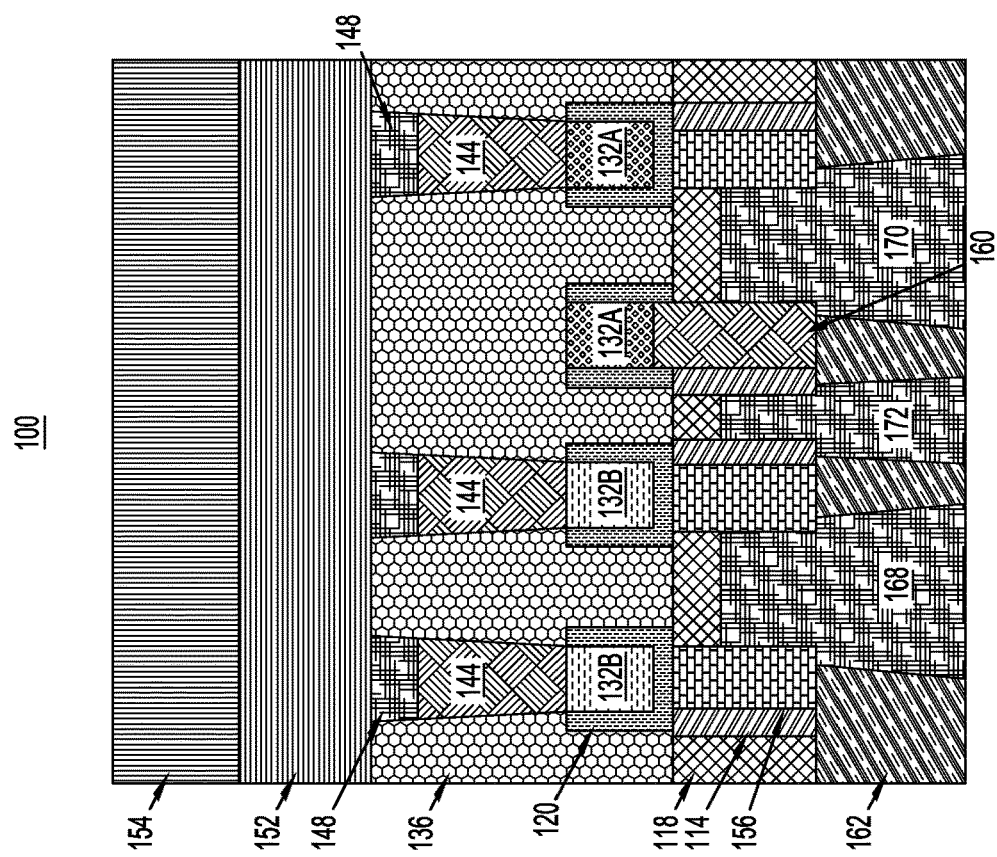
FIG. 20E is a cross-sectional view illustrating the semiconductor structure taken along the Y2-Y2 axis of FIG. 20A at the twentieth-intermediate fabrication stage, according to an illustrative embodiment.
Figure 20D:
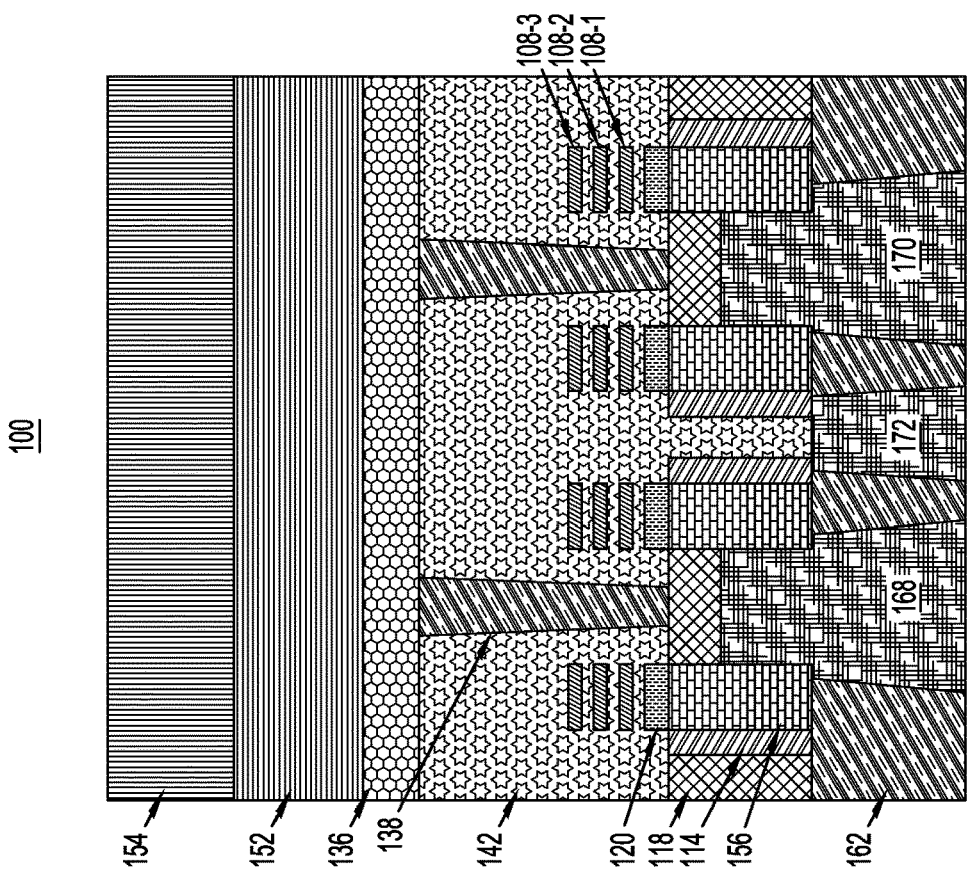
FIG. 20D is a cross-sectional view illustrating the semiconductor structure taken along the Y1-Y1 axis of FIG. 20A at the twentieth-intermediate fabrication stage, according to an illustrative embodiment.
Figure 21D:
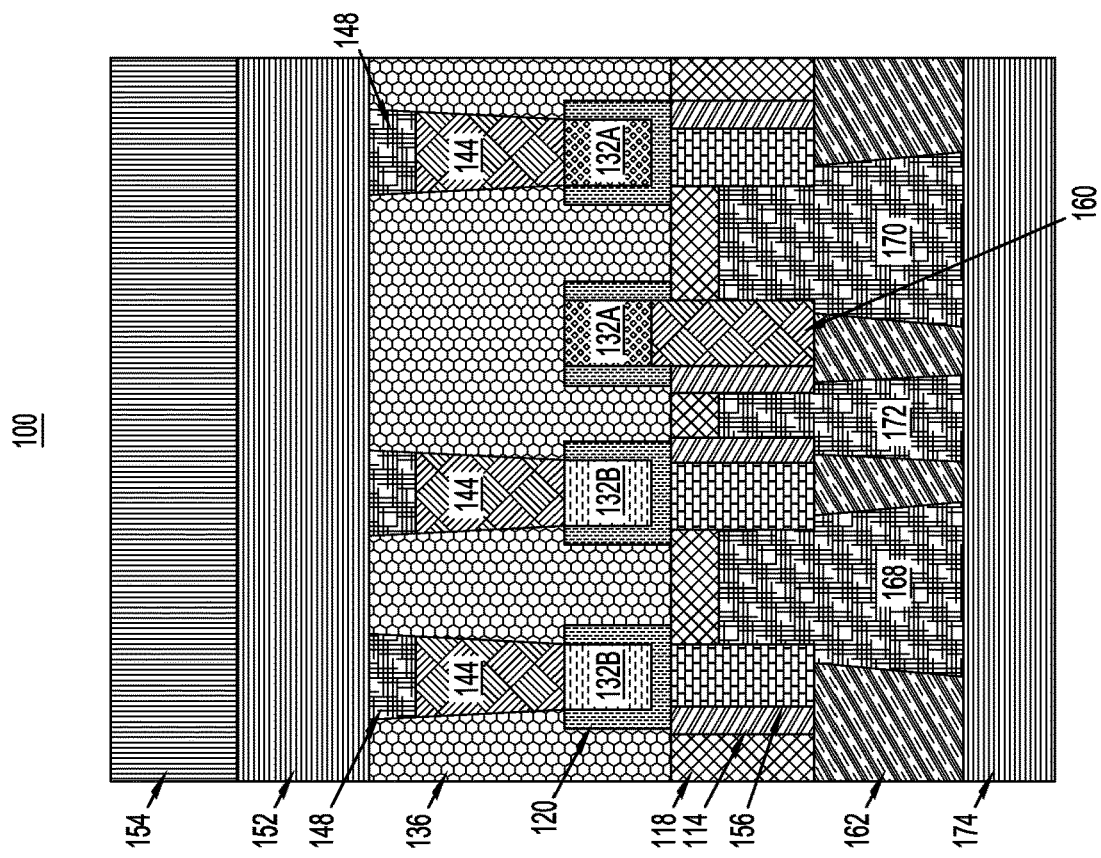
FIG. 21D is a cross-sectional view illustrating the semiconductor structure taken along the Y2-Y2 axis of FIG. 20A at the twenty first-intermediate fabrication stage, according to an illustrative embodiment.
Figure 21C:
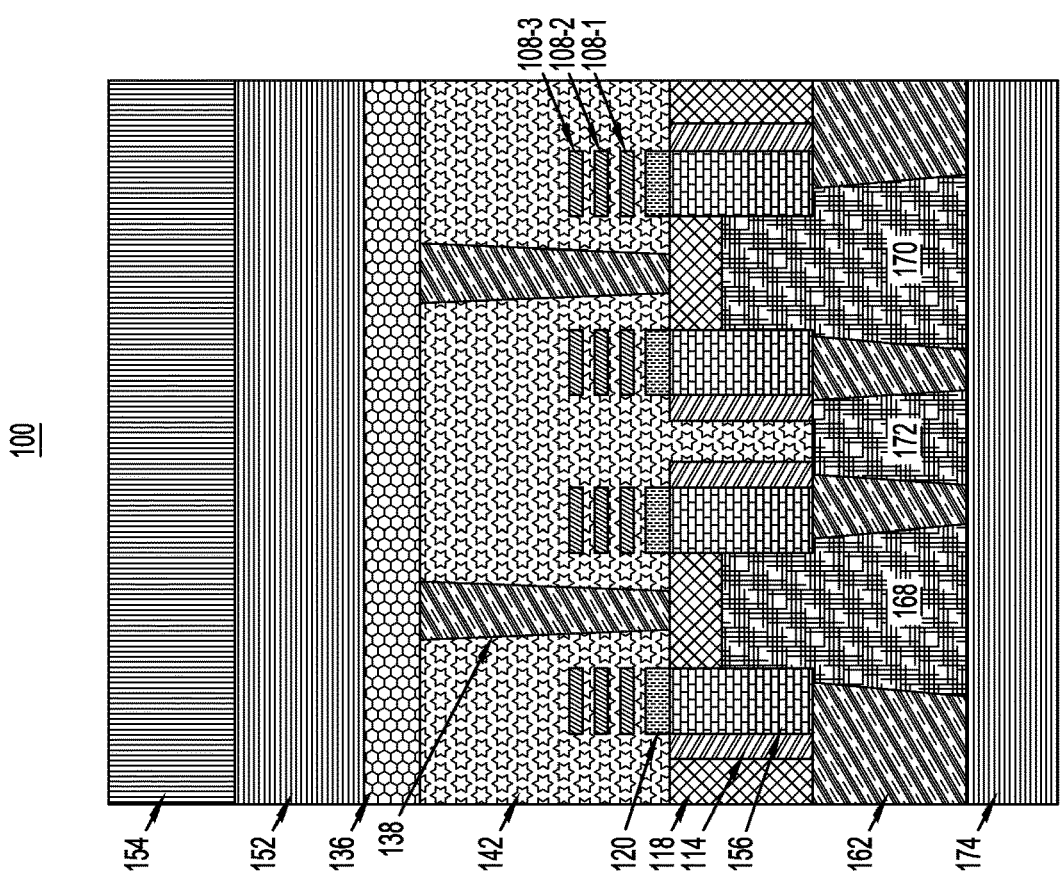
FIG. 21C is a cross-sectional view illustrating the semiconductor structure taken along the Y1-Y1 axis of FIG. 20A at the twenty first-intermediate fabrication stage, according to an illustrative embodiment.

As shown in FIGS. 20C and 20D, power (Vdd) rails 170 is partially disposed on a sidewall and bottom surface of backside source/drain contacts 160. Thus, backside source/drain contacts 160 can also be referred to as partially wrapped-around backside source/drain contacts 160.

FIGS. 21A-21D illustrate semiconductor structure 100 at a twenty-first-intermediate fabrication stage. During this stage, backside power delivery network 174 is formed over the semiconductor structure 100 including ground (GND or Vss) rails 168, power (Vdd) rails 170 and signal rails 172 and is based on creation of a wiring scheme that is disposed on both sides of the device layer (front end of line structure).

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETS, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a first backside power rail disposed on a portion of a sidewall and a bottom surface of a backside source/drain contact;
    a first sidewall spacer disposed on another sidewall of the backside source/drain contact; and
    a backside signal line disposed on the first sidewall spacer and separated from the backside source/drain contact and the first backside power rail.

2. The semiconductor structure according to claim 1, wherein the backside signal line is disposed between the first sidewall spacer and a second sidewall spacer.

3. The semiconductor structure according to claim 2, further comprising a first interlayer dielectric layer disposed on the second sidewall spacer and separated from the backside signal line.

4. The semiconductor structure according to claim 1, further comprising a second backside power rail, wherein the second backside power rail is separated from the backside signal line by a first interlayer dielectric layer and a second sidewall spacer.

5. The semiconductor structure according to claim 4, wherein the first backside power rail, the second backside power rail and the backside signal line are disposed in a second interlayer dielectric layer.

6. A semiconductor structure, comprising:
    a backside source/drain contact connected to a first backside power rail; and
    a gate structure connected to a backside signal line;
    wherein the backside source/drain contact is separated from the backside signal line and separated from the backside signal line by a first sidewall spacer.

7. The semiconductor structure according to claim 6, wherein the first backside power rail is disposed on a portion of a sidewall and a bottom surface of the backside source/drain contact.

8. The semiconductor structure according to claim 6, wherein the backside signal line is disposed between the first sidewall spacer and a second sidewall spacer.

9. The semiconductor structure according to claim 8, further comprising a first interlayer dielectric layer disposed on the second sidewall spacer and separated from the backside signal line.

10. The semiconductor structure according to claim 6, further comprising a second backside power rail.

11. The semiconductor structure according to claim 10, wherein the second backside power rail is separated from the backside signal line by a first interlayer dielectric layer and a second sidewall spacer.

12. The semiconductor structure according to claim 11, wherein the first backside power rail, the second backside power rail and the backside signal line are disposed in a second interlayer dielectric layer.

13. The semiconductor structure according to claim 6, further comprising a backside signal line via connecting the gate structure to the backside signal line.

14. A semiconductor structure, comprising:
    a first nanosheet field-effect transistor device comprising a source/drain region and a first gate structure;
    a second nanosheet field-effect transistor device adjacent the first field-effect nanosheet transistor device, the second nanosheet field-effect transistor device comprising a second gate structure;
    a backside source/drain contact disposed on the source/drain region of the first nanosheet field-effect transistor device;
    a backside signal line disposed between the first nanosheet field-effect transistor device and the second nanosheet field-effect transistor device;
    a backside signal line via connecting the backside signal line to the first gate structure and the second gate structure;
    a first sidewall spacer disposed between the backside source/drain contact and the backside signal line; and
    a first backside power rail connected to the backside source/drain contact;
    wherein the backside signal line is disposed between the first sidewall spacer and a second sidewall spacer.

15. The semiconductor structure according to claim 14, wherein the first backside power rail is disposed on a portion of a sidewall and a bottom surface of the backside source/drain contact.

16. The semiconductor structure according to claim 14, further comprising a first interlayer dielectric layer disposed on the second sidewall spacer and separated from the backside signal line.

17. The semiconductor structure according to claim 14, further comprising a second backside power rail, wherein the second backside power rail is separated from the backside signal line by a first interlayer dielectric layer and a second sidewall spacer.

18. The semiconductor structure according to claim 17, wherein the first backside power rail, the second backside power rail and the backside signal line are disposed in a second interlayer dielectric layer.

19. The semiconductor structure according to claim 17, further comprising a backside power delivery network disposed on the first backside power rail, the second backside power rail and the backside signal line.

20. The semiconductor structure according to claim 14, wherein the first nanosheet field-effect transistor device is a p-type nanosheet field-effect transistor device and the second nanosheet field-effect transistor device is an n-type nanosheet field-effect transistor device.

* * * * *